United States Patent
Cheng et al.

(10) Patent No.: US 12,389,653 B2
(45) Date of Patent: Aug. 12, 2025

(54) SEMICONDUCTOR DEVICES AND METHODS OF FABRICATING THE SAME

(71) Applicant: Taiwan Semiconductor Manufacturing Company, Ltd., Hsin-Chu (TW)

(72) Inventors: Chun-Fai Cheng, Hong Kong (TW); Chang-Miao Liu, Hsinchu (TW); Ming-Lung Cheng, Kaohsiung County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 518 days.

(21) Appl. No.: 17/719,614

(22) Filed: Apr. 13, 2022

(65) Prior Publication Data
US 2023/0335616 A1 Oct. 19, 2023

(51) Int. Cl.
H10D 64/01 (2025.01)
H01L 21/28 (2025.01)
(Continued)

(52) U.S. Cl.
CPC ..... *H10D 64/017* (2025.01); *H01L 21/28123* (2013.01); *H10D 30/031* (2025.01);
(Continued)

(58) Field of Classification Search
None
See application file for complete search history.

(56) References Cited

U.S. PATENT DOCUMENTS

| 6,214,719 B1* | 4/2001 | Nag | H01L 21/7682 438/622 |
| 2015/0255578 A1* | 9/2015 | Chang | H01L 29/7848 438/300 |

(Continued)

FOREIGN PATENT DOCUMENTS

| TW | I737136 B | 8/2021 |
| TW | 202209415 A | 3/2022 |
| TW | 202209564 A | 3/2022 |

OTHER PUBLICATIONS

Cheng, Jung-Chien et al "Hybrid Semiconductor Device" U.S. Appl. No. 17/226,851; Assignee: Taiwan Semiconductor Manufacturing Company, Ltd. 38 pages of Specification, 37 pages of Drawings.

(Continued)

*Primary Examiner* — Yara B Green
*Assistant Examiner* — Fakeha Sehar
(74) *Attorney, Agent, or Firm* — HAYNES AND BOONE, LLP

(57) ABSTRACT

Semiconductor devices and methods are provided. An exemplary method according to the present disclosure includes providing fin-shaped active regions protruding from a substrate, forming cladding layers extending along sidewalls of the fin-shaped active regions, forming a dielectric feature over the substrate to fill space between two adjacent cladding layers, forming a gate structure over channel regions of the fin-shaped active regions and over a first portion of the cladding layers, performing an etching process to remove a second portion of the cladding layers not covered by the gate structure to form sidewall spacer trenches, forming a dielectric spacer in each of the sidewall spacer trenches, and after the forming of the dielectric spacers, forming source/drain features.

20 Claims, 25 Drawing Sheets

(51) Int. Cl.
*H10D 30/01* (2025.01)
*H10D 30/67* (2025.01)
*H10D 62/10* (2025.01)
*H10D 64/66* (2025.01)

(52) U.S. Cl.
CPC ..... *H10D 30/6713* (2025.01); *H10D 30/6735* (2025.01); *H10D 30/6757* (2025.01); *H10D 62/118* (2025.01); *H10D 64/679* (2025.01)

(56) References Cited

U.S. PATENT DOCUMENTS

| | | | |
|---|---|---|---|
| 2020/0075423 A1* | 3/2020 | Kwok | H01L 21/823481 |
| 2020/0343376 A1* | 10/2020 | Chiang | H01L 29/66439 |
| 2021/0098302 A1* | 4/2021 | Ju | H10B 10/00 |
| 2021/0343645 A1 | 11/2021 | Peng | |
| 2021/0375857 A1 | 12/2021 | Huang | |

OTHER PUBLICATIONS

Chiang, Kuo-Cheng et al "Nanosheet Devices With Hybrid Structures And Methods Of Fabricating The Same" U.S. Appl. No. 17/520,385, Assignee: Taiwan Semiconductor Manufacturing Company, Ltd. 35 pages of Specification, 57 Pages of Drawings.

\* cited by examiner

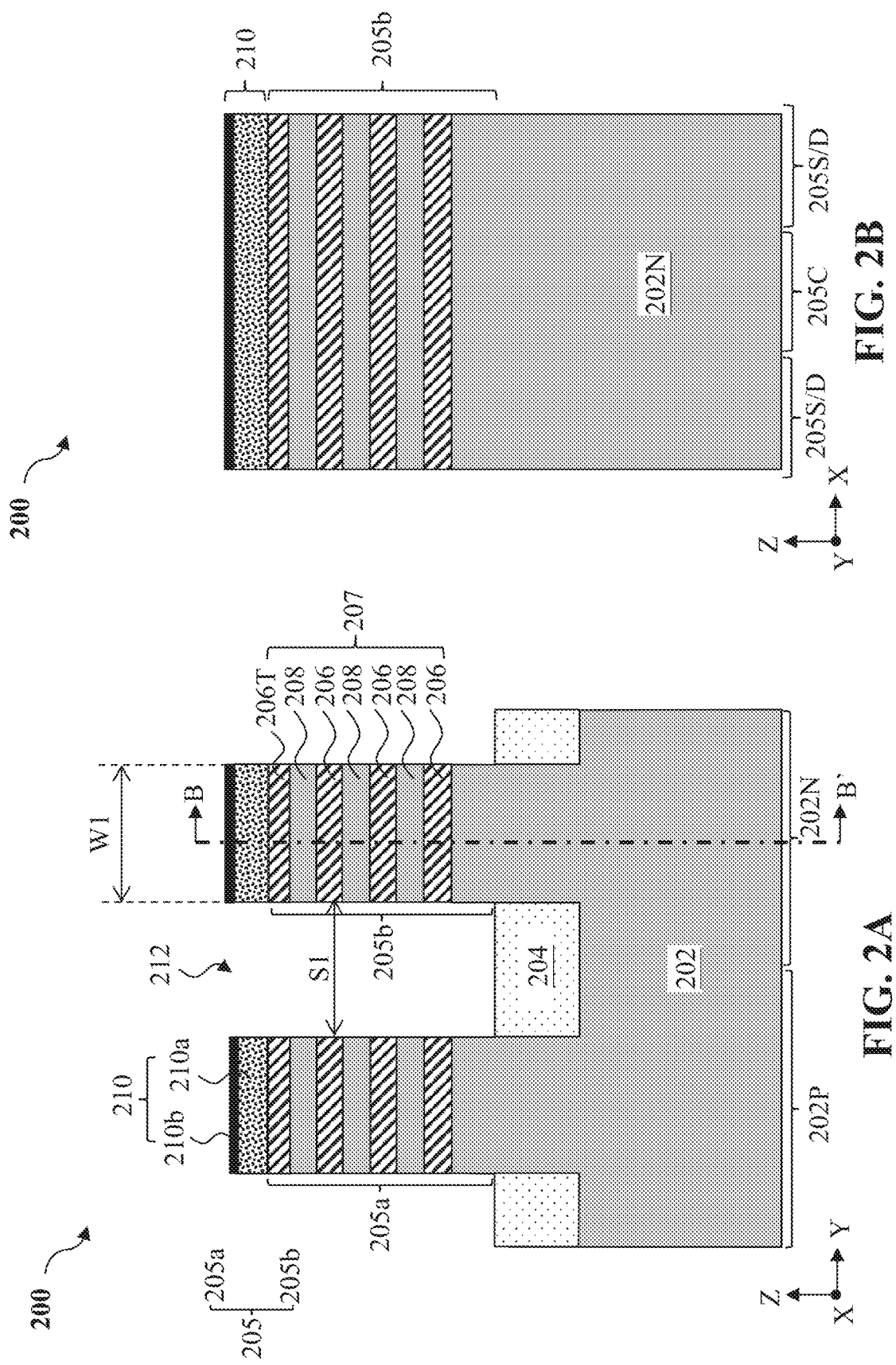

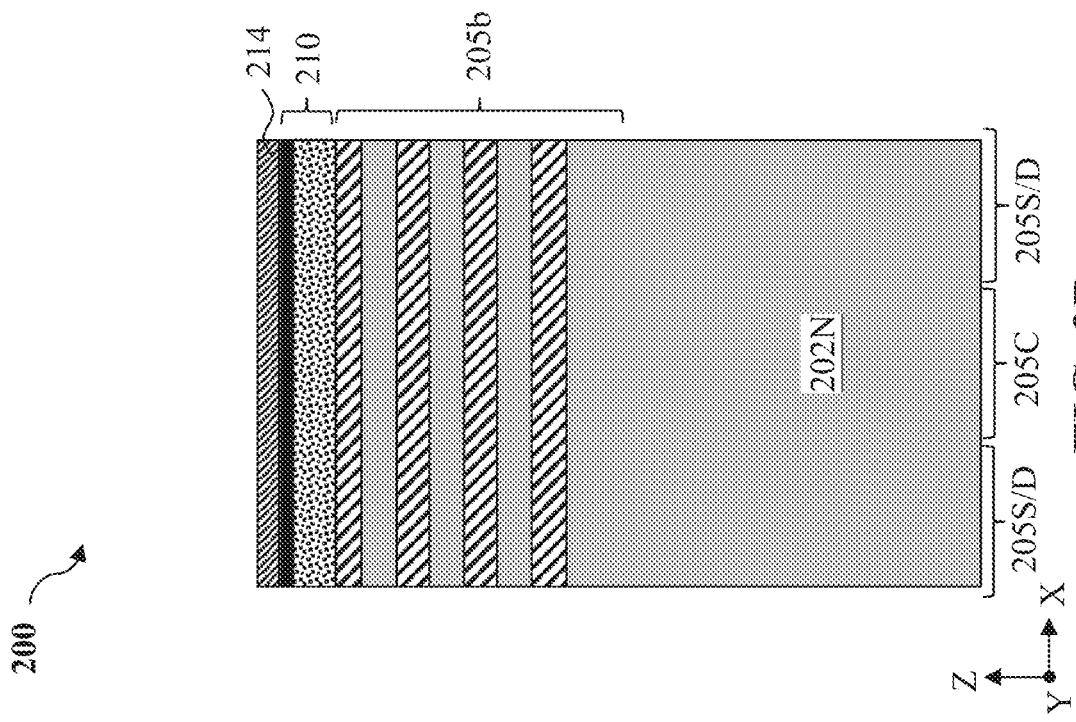
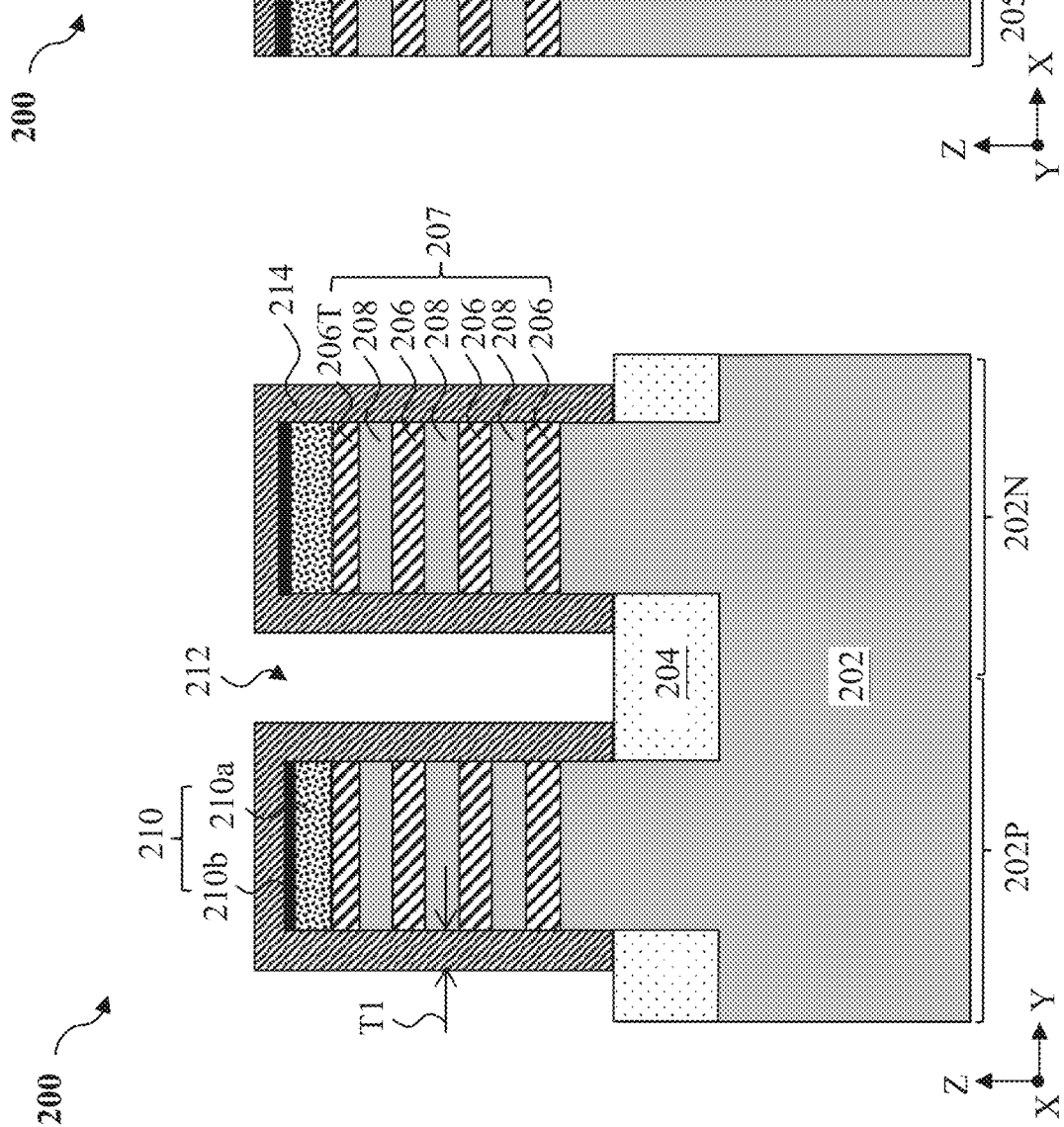
FIG. 3A
FIG. 3B

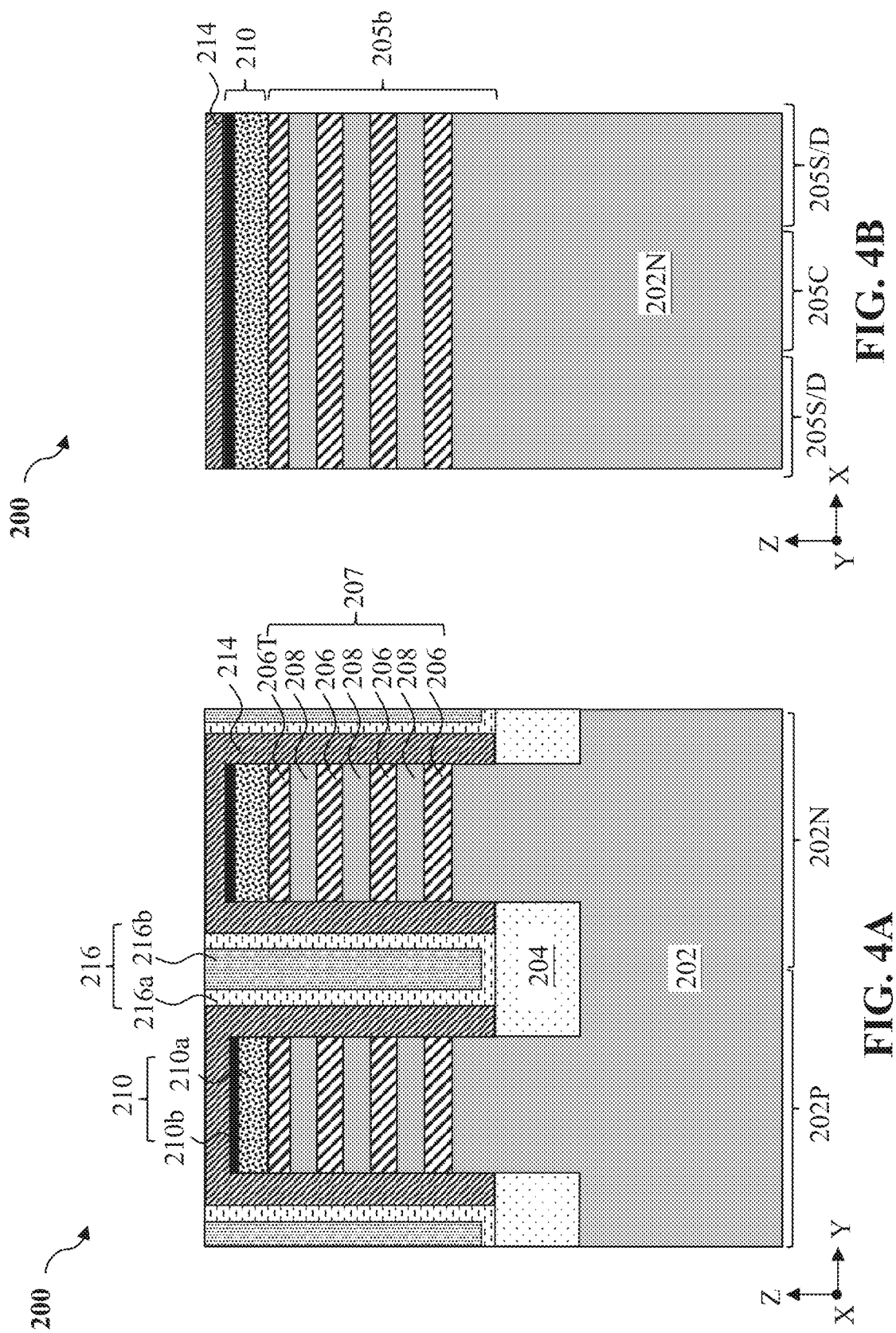

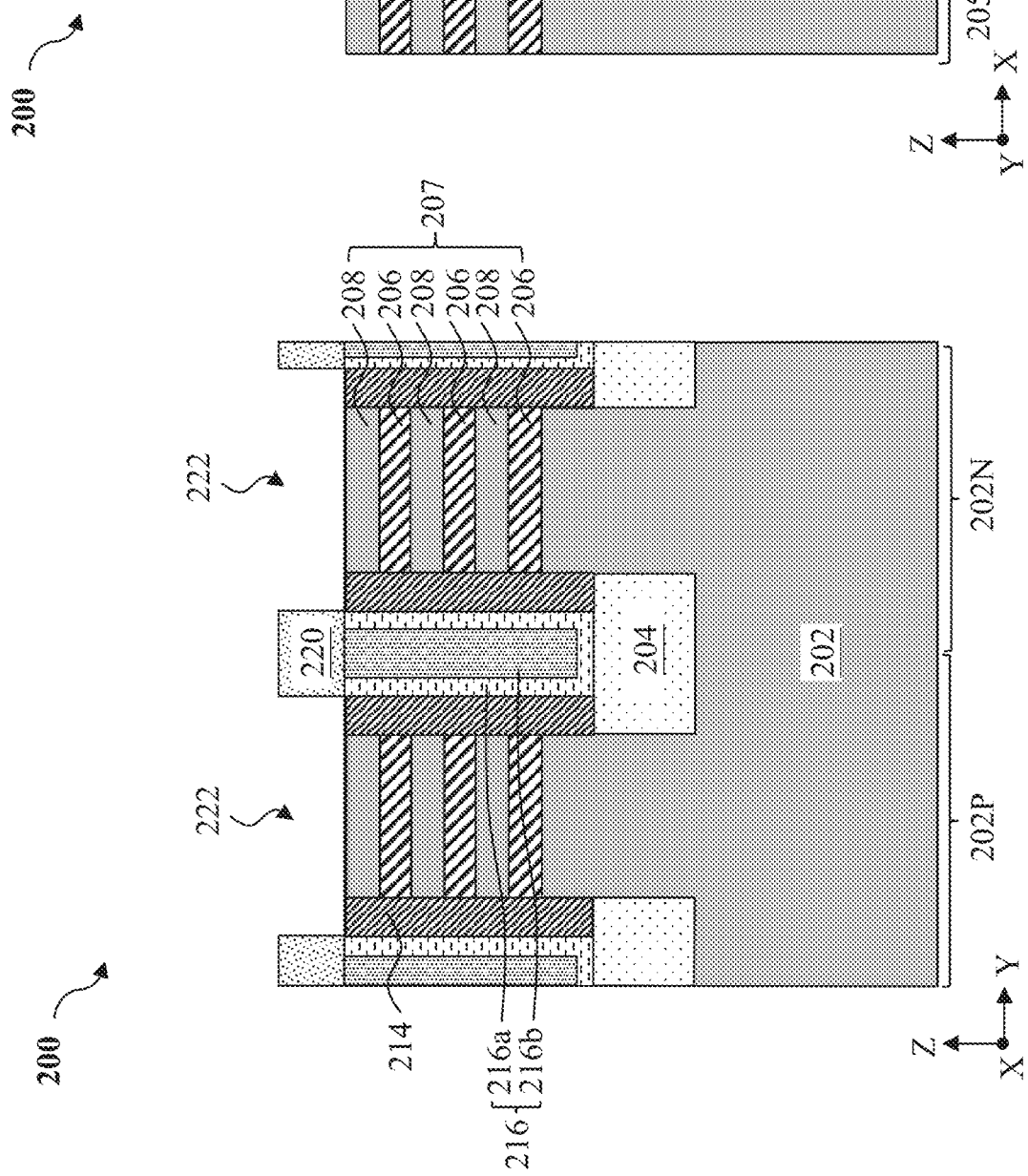
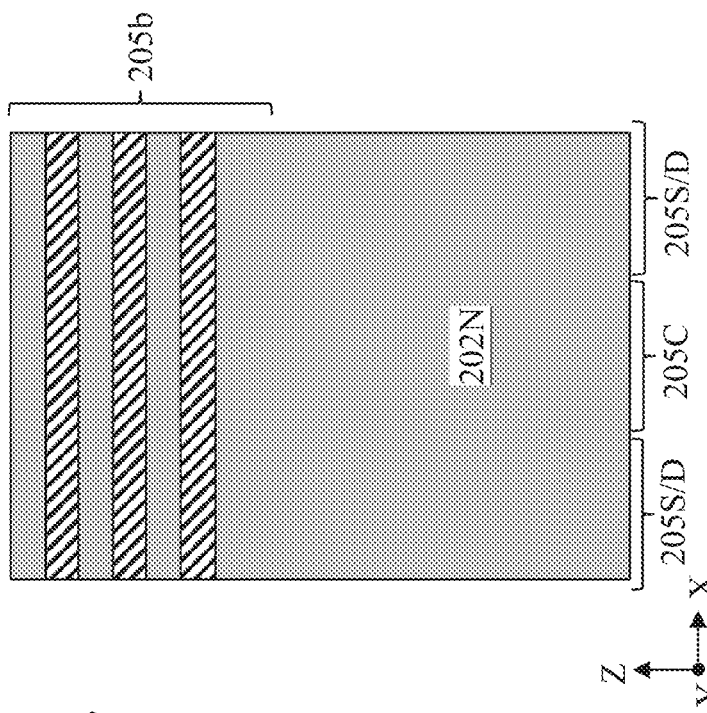
FIG. 7A
FIG. 7B

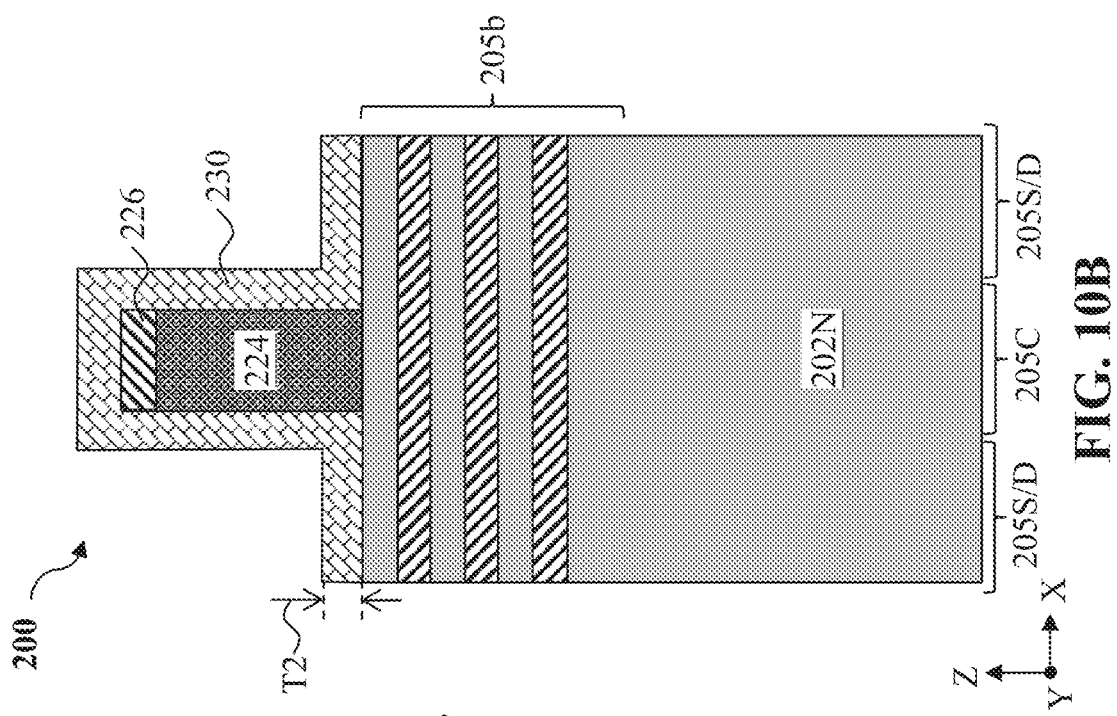
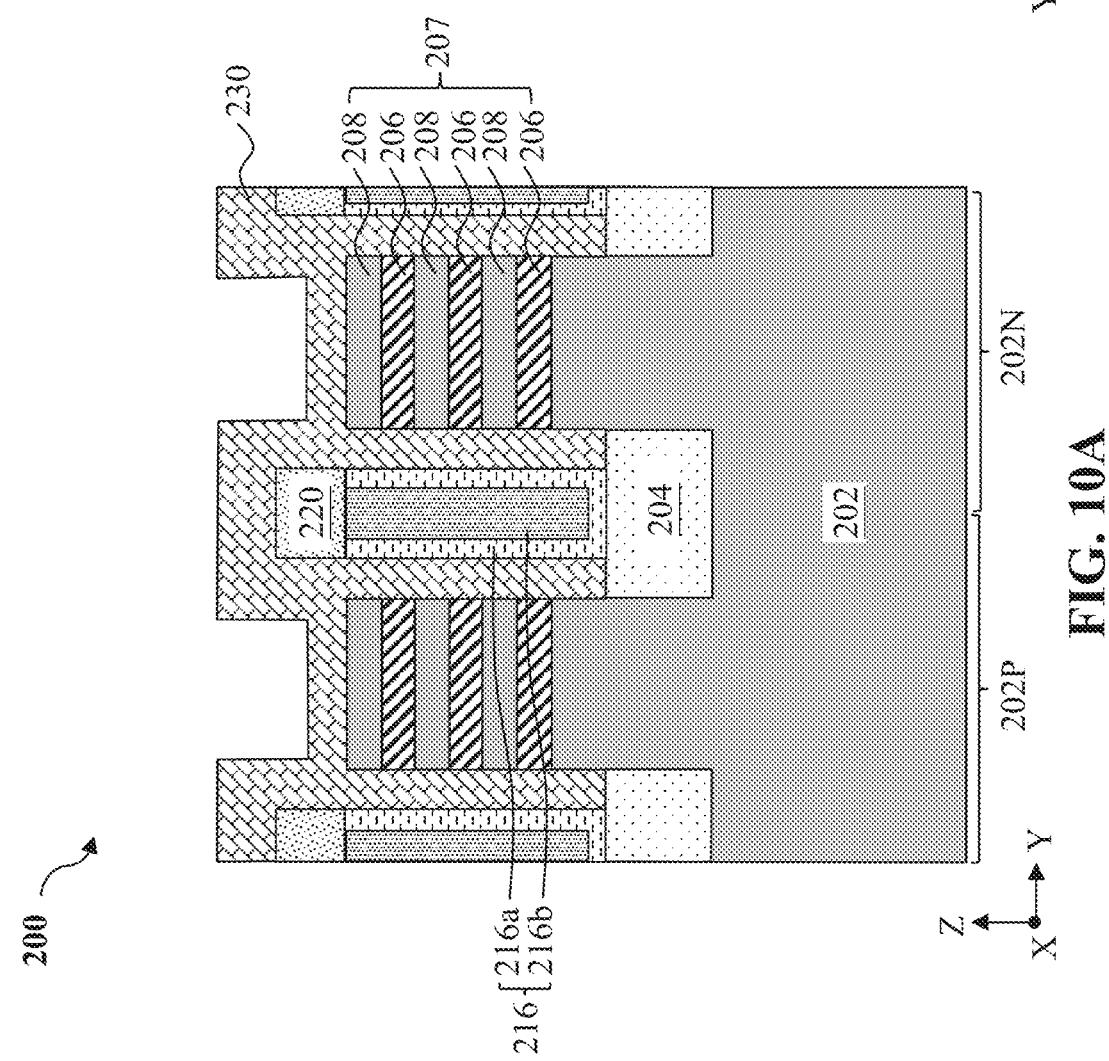
FIG. 10A
FIG. 10B

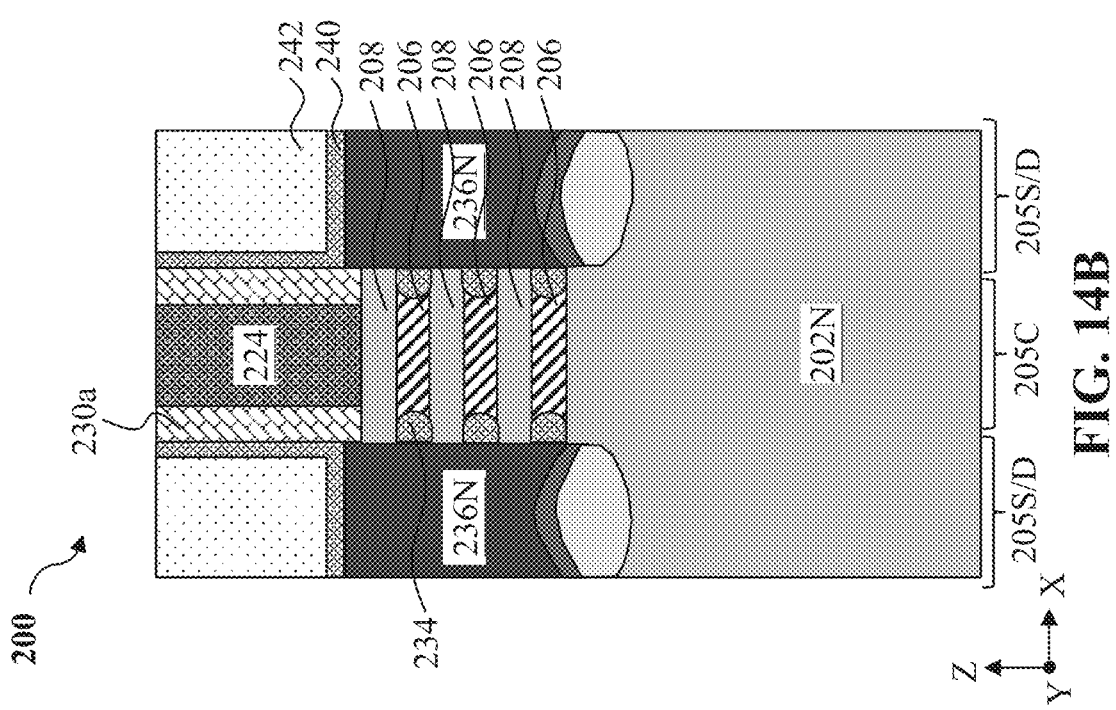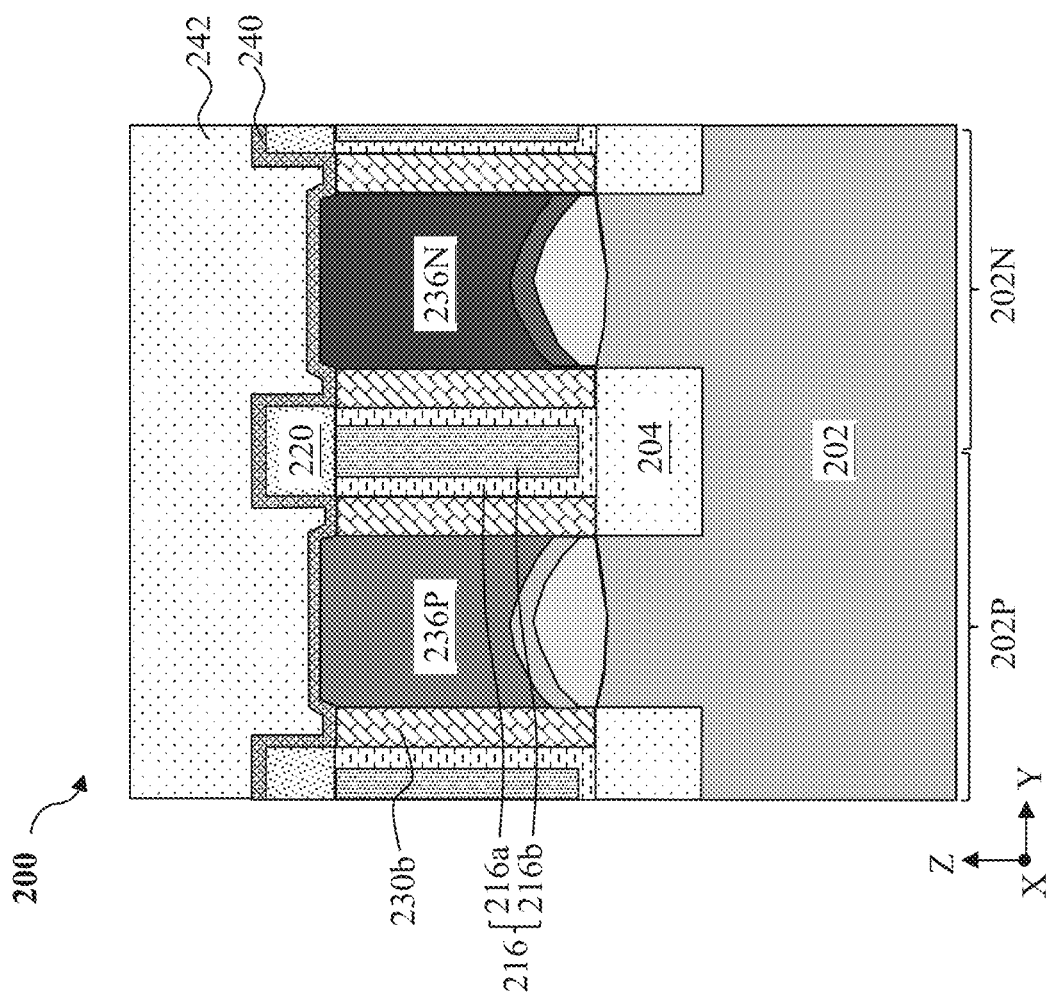
FIG. 14A
FIG. 14B

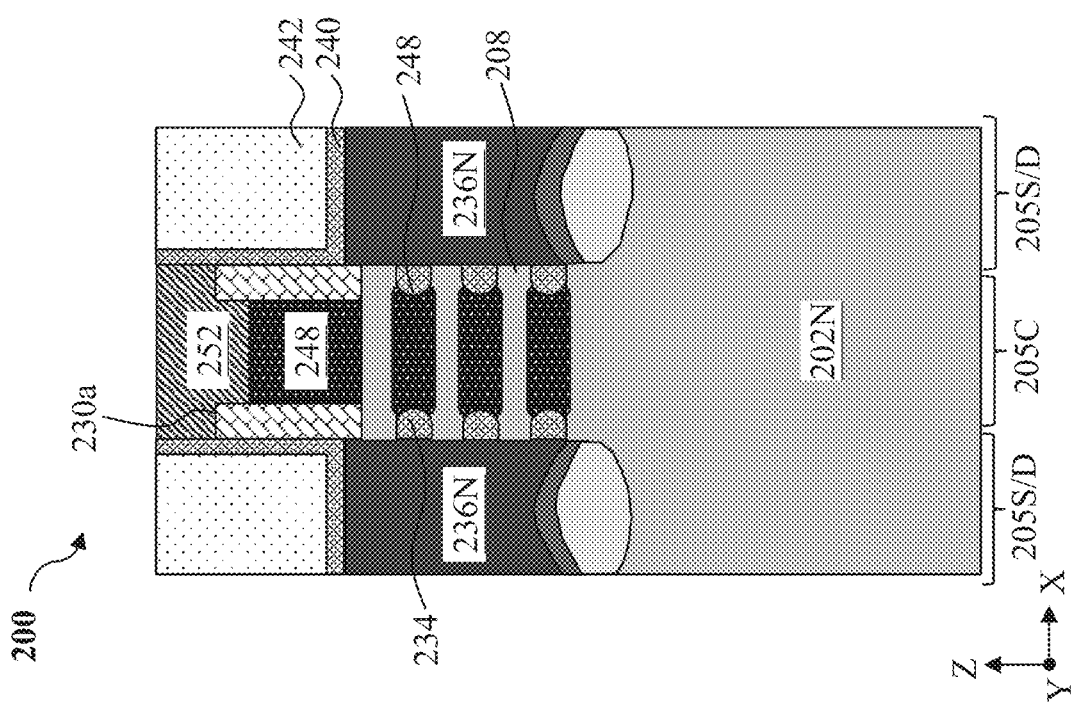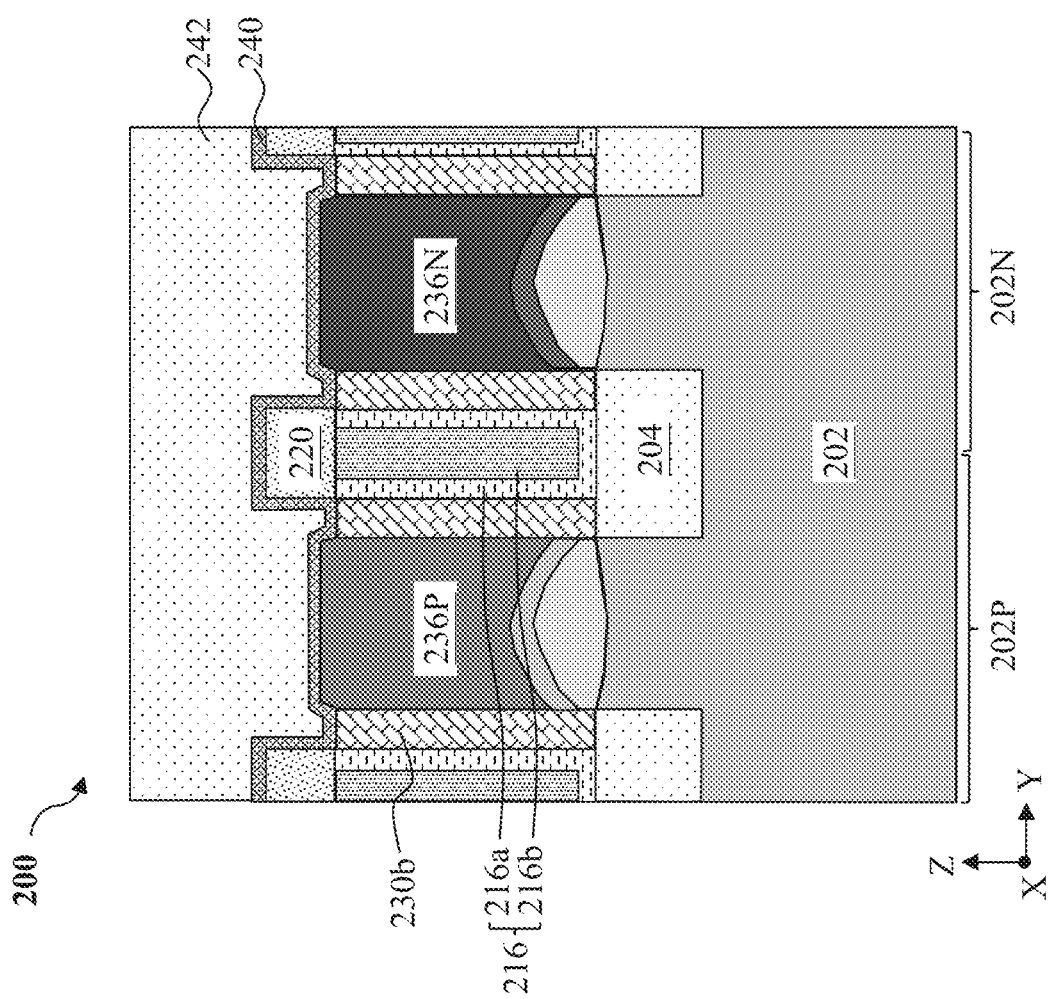

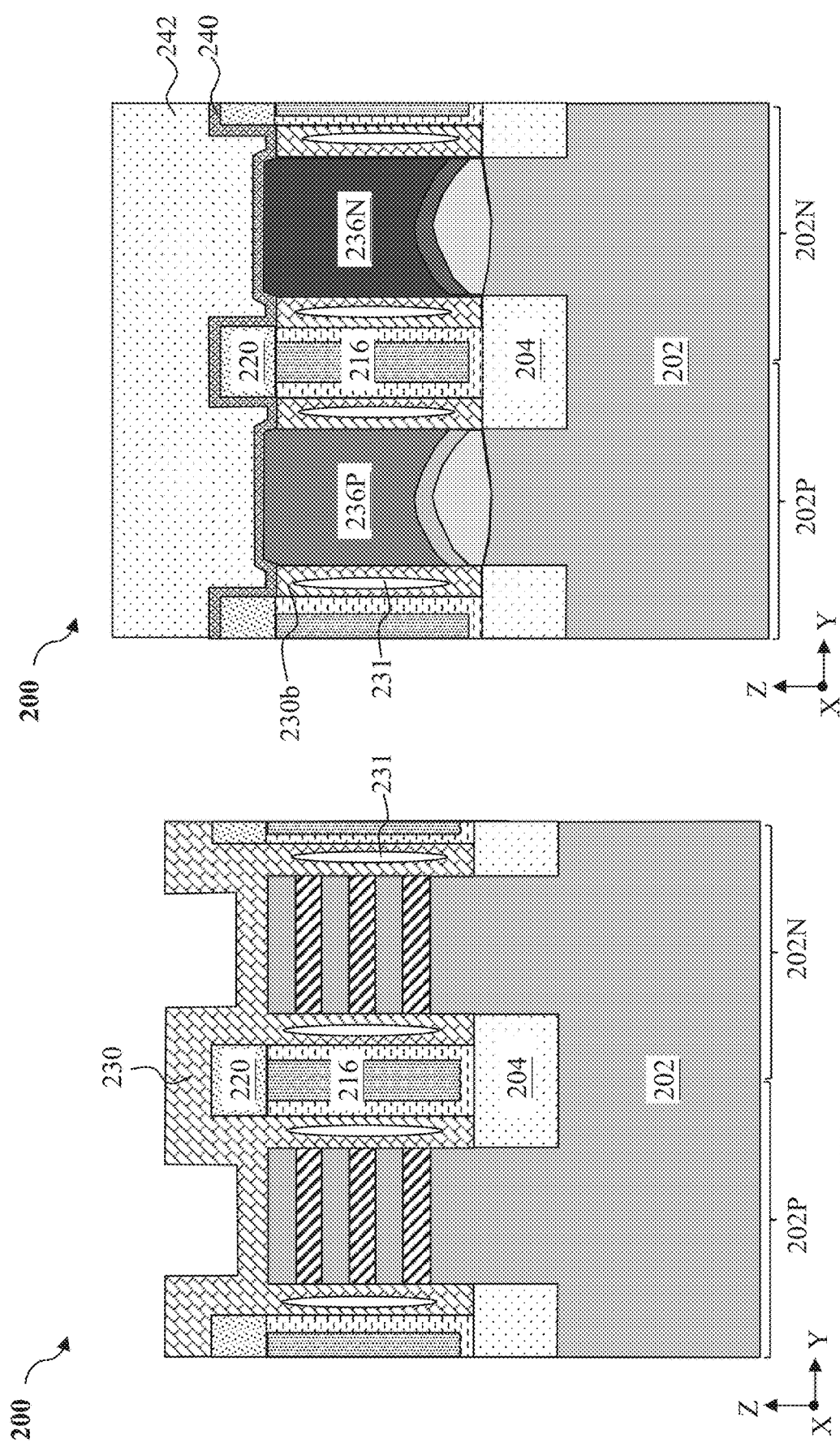

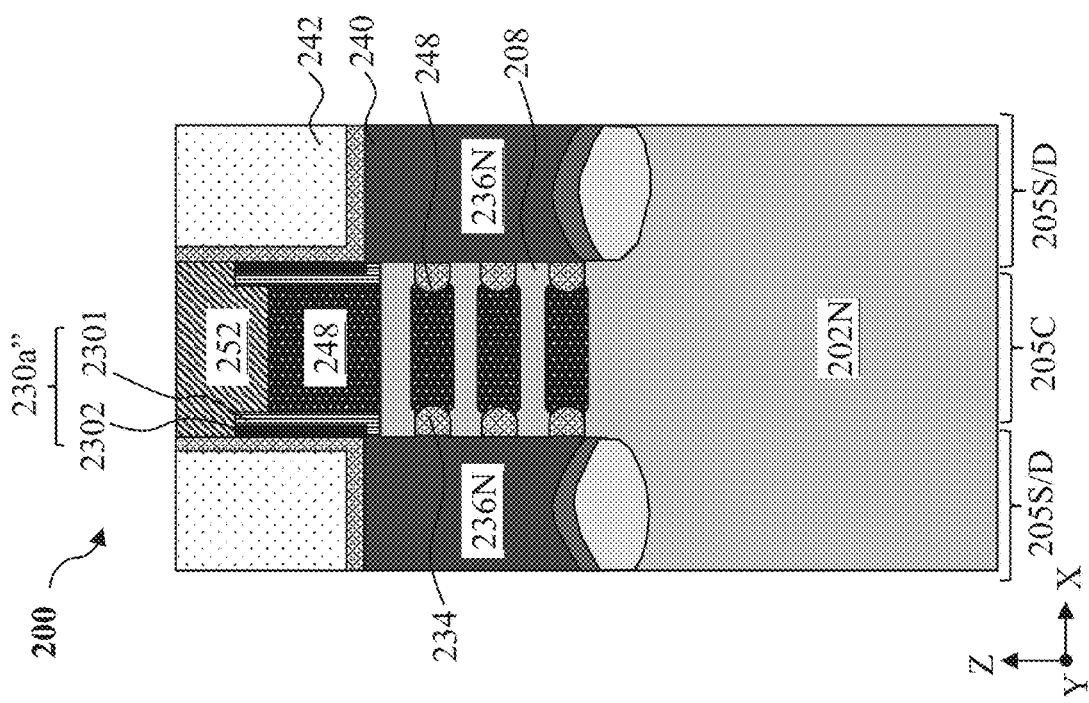
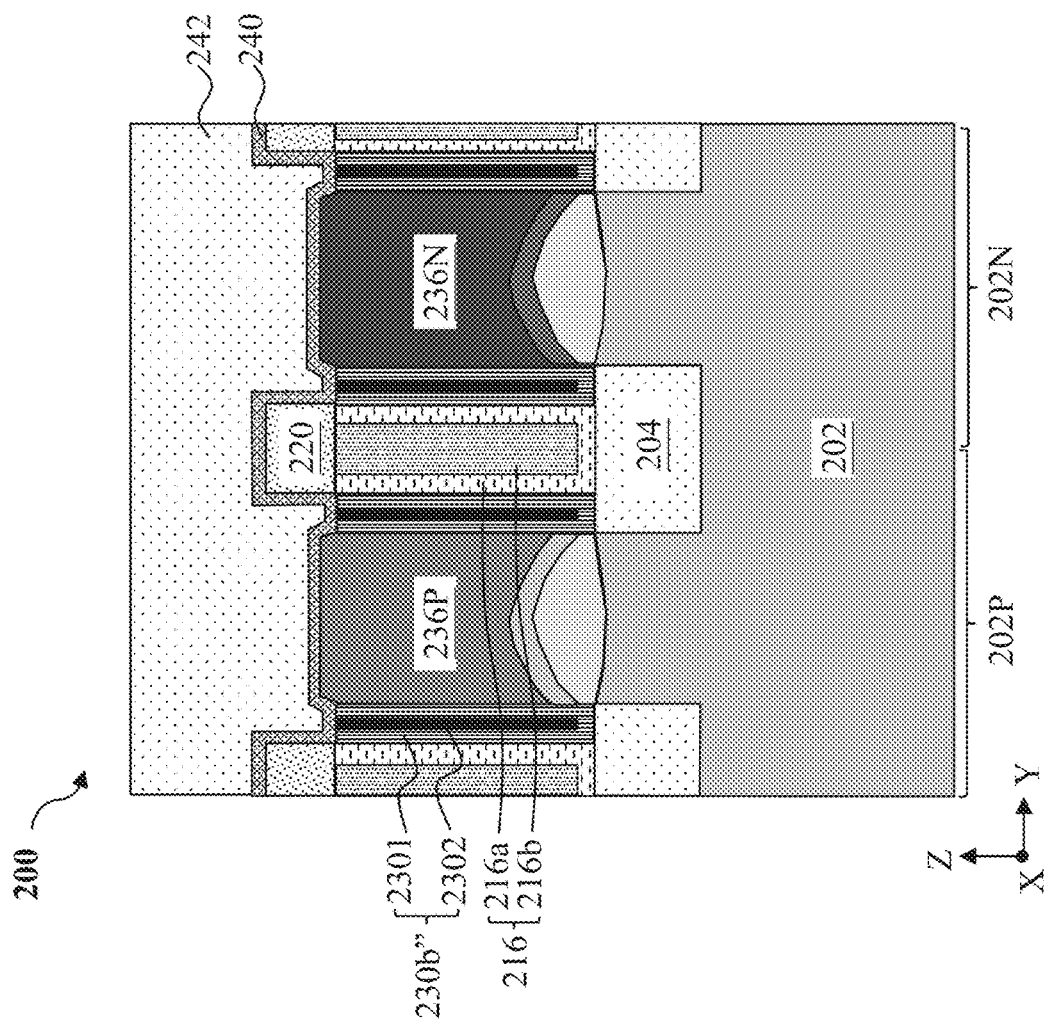
FIG. 22B
FIG. 22A

SEMICONDUCTOR DEVICES AND METHODS OF FABRICATING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

However, as semiconductor devices continue to scale down, challenges arise in achieving desired density and performance. For example, due to densely spaced active regions and the lateral growth of source/drain features, two adjacent source/drain features may merge, leading to unintentional electrical shorting. If electrical shorting occurs, it may degrade device performance and/or lead to device failures. In addition, due to the densely spaced active regions, parasitic capacitance may impact the overall performance of an IC device. In some examples, high parasitic capacitance may lead to lower device speed (e.g., RC delays) when separation distances between the active device regions are reduced to meet design requirements of smaller technology nodes. Accordingly, although existing devices and methods for fabricating such have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 3A, 4A, 5A, 6A, 7A, 8A, 9A, 10A, 11A, 12A, 13A, 14A, 15A, 16A, and 17A (FIGS. 2A-17A) illustrate cross-sectional views of a workpiece during various fabrication stages in the method of FIG. 1, according to one or more aspects of the present disclosure.

FIGS. 2B, 3B, 4B, 5B, 6B, 7B, 8B, 9B, 10B, 11B, 12B, 13B, 14B, 15B, 16B, and 17B (FIGS. 2B-17B) illustrate fragmentary cross-sectional views of the workpiece taken along line B-B' shown in FIG. 2A during various fabrication stages in the method of FIG. 1, according to one or more aspects of the present disclosure.

FIGS. 18 and 19 illustrate cross-sectional views of a workpiece during a fabrication process according to the method of FIG. 1, according to a first alternative embodiment and one or more aspects of the present disclosure.

FIGS. 22A and 22B illustrate fragmentary cross-sectional views of a workpiece during various fabrication stages in the method of FIG. 1, according to a third alternative embodiment and one or more aspects of the present disclosure.

DETAILED DESCRIPTION

Figure 1:
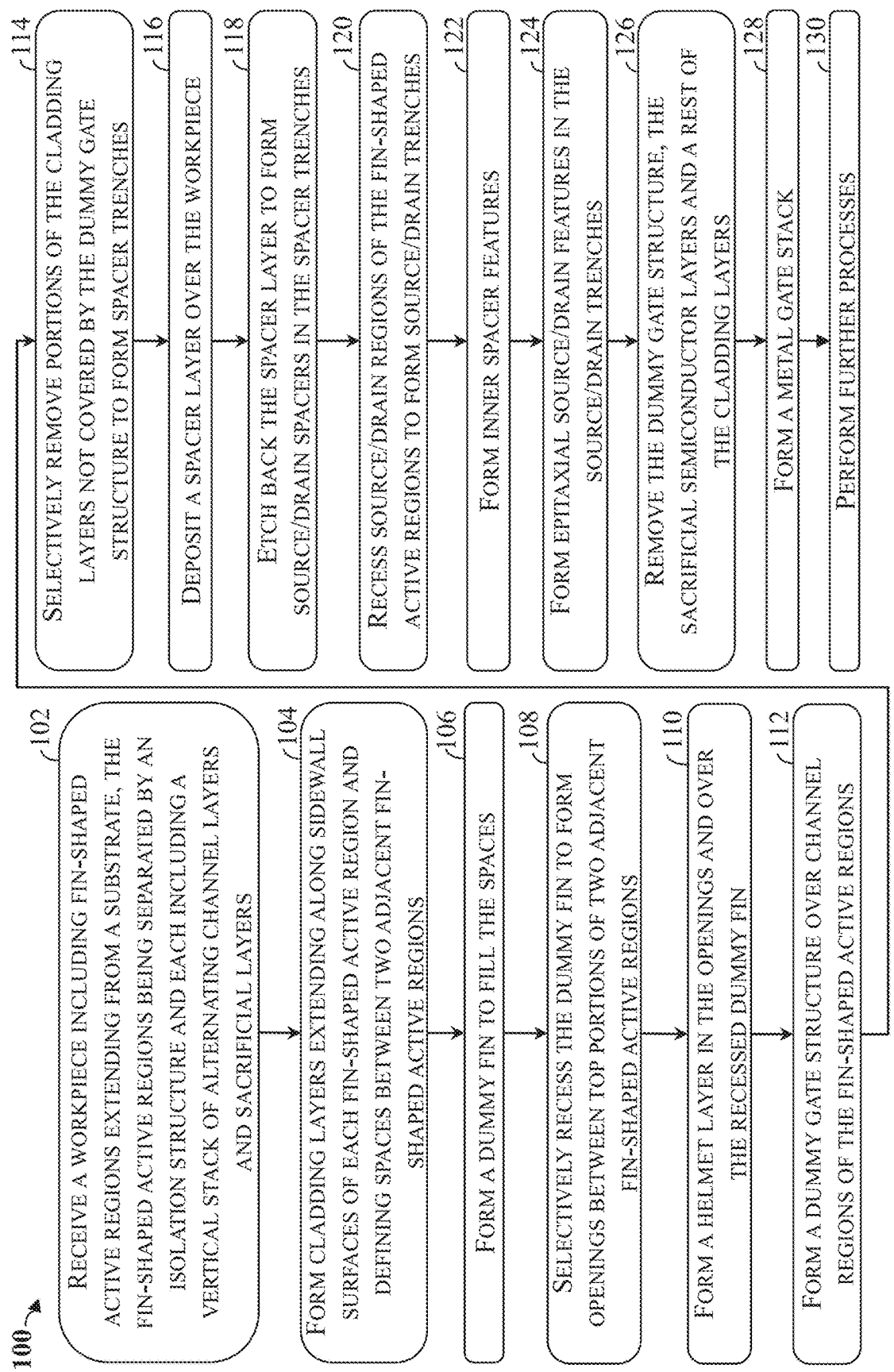
FIG. 1 illustrates a flowchart of an exemplary method for fabricating a semiconductor device, according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

As integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, or other nanostructures and for that reason, an MBC transistor may also be referred to as a nanowire transistor or a nanosheet transistor.

Formation of a FinFET or an MBC transistor includes patterning semiconductor material(s) into fin-shaped active regions, forming a dummy fin between two adjacent fin-shaped active regions to isolate source/drain features to be formed in source/drain trenches. In some embodiments, a helmet layer may be formed on the dummy fin and work together with the dummy fin to electrically divide a functional gate stack into two pieces. As described above, aggressive scaling down of IC dimensions has resulted in densely spaced features, such as a reduced separation distance between two adjacent fin-shaped active regions. Due to the reduced separation distance between two adjacent fin-shaped active regions, the dimension of the dummy fin may be reduced, increasing the possibility of unintentional electrical shorting between two adjacent source/drain features, thereby leading to a degraded device performance and/or device failures. Additionally, source/drain features that are disposed between two adjacent dummy fins may disadvantageously increase the parasitic capacitance of the FinFET or the MBC transistor.

The present disclosure provides semiconductor devices and methods for forming source/drain spacers extending along sidewall surfaces of to-be-formed source/drain features, thereby confining the lateral growth of the source/drain features. In an exemplary embodiment, a method includes providing fin-shaped active regions protruding from a substrate, forming cladding layers extending along sidewalls of the fin-shaped active regions, forming a dielectric feature over the substrate to fill space between two adjacent cladding layers, forming a gate structure over channel regions of the fin-shaped active regions and over a first portion of the cladding layers, performing an etching process to remove a second portion of the cladding layers not covered by the gate structure to form sidewall spacer trenches, forming a dielectric spacer in each of the sidewall spacer trenches, and after the forming of the dielectric spacers, forming source/drain features.

The various aspects of the present disclosure will now be described in more detail with reference to the figures. In that regard, FIG. 1 is a flowchart illustrating method 100 of forming a semiconductor device according to embodiments of the present disclosure. Method 100 is described below in conjunction with FIGS. 2A-17A, 2B-17B, 7C-9C, 13C, 17C, 8D-9D, 18-19, 20-21, and FIGS. 22A-22B, which are fragmentary cross-sectional views or top views of a workpiece 200 at different stages of fabrication according to embodiments of method 100. Method 100 is merely an example and is not intended to limit the present disclosure to what is explicitly illustrated therein. Additional steps may be provided before, during and after the method 100 and some steps described can be replaced, eliminated, or moved around for additional embodiments of the method. Not all steps are described herein in detail for reasons of simplicity. Because the workpiece 200 will be fabricated into a corresponding semiconductor device 200 upon conclusion of the fabrication processes, the workpiece 200 may be referred to as the semiconductor device 200 as the context requires. For avoidance of doubts, the X, Y and Z directions in the figures are perpendicular to one another and are used consistently throughout the figures. Throughout the present disclosure, like reference numerals denote like features unless otherwise excepted.

Referring to FIGS. 1, 2A and 2B, method 100 includes a block 102 where a workpiece 200 is received. FIG. 2A depicts a cross-sectional view of an exemplary workpiece 200 when viewed from the X direction, and FIG. 2B depicts a cross-sectional view of the workpiece 200 when viewed from the Y direction and taken along line B-B' shown in FIG. 2A. The workpiece 200 may be an intermediate structure fabricated during processing of an IC, or a portion thereof, that may comprise static random-access memory (SRAM) and/or other logic circuits, passive components such as resistors, capacitors, and inductors, and active components such as MBC transistors, FinFETs, metal-oxide semiconductor field effect transistors (MOSFETs), complementary metal-oxide semiconductor (CMOS) transistors, bipolar transistors, high voltage transistors, high frequency transistors, and/or other transistors. In the present embodiments, the workpiece 200 includes one or more MBC transistors. Additional features can be added to the workpiece 200, and some of the features described below can be replaced, modified, or eliminated in other embodiments of the workpiece 200.

As shown in FIGS. 2A and 2B, the workpiece 200 includes a substrate 202. In an embodiment, the substrate 202 is a bulk silicon substrate. The substrate 202 may include other semiconductor materials in various embodiments, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In some alternative embodiments, the substrate 202 may be a semiconductor-on-insulator substrate, such as a silicon-on-insulator (SOI) substrate, a silicon germanium-on-insulator substrate, or a germanium-on-insulator (GeOI) substrate. The substrate 202 can include various doped regions configured according to design requirements of the semiconductor device 200. P-type doped regions may include p-type dopants, such as boron (B), boron difluoride ($BF_2$), other p-type dopant, or combinations thereof. N-type doped regions may include n-type dopants, such as phosphorus (P), arsenic (As), other n-type dopant, or combinations thereof. The various doped regions can be formed directly on and/or in the substrate 202, for example, providing a p-well structure, an n-well structure, or combinations thereof. An ion implantation process, a diffusion process, and/or other suitable doping process can be performed to form the various doped regions. Referring to FIG. 2A, the substrate 202 includes a first region 202N for formation of n-type MBC transistors and a second region 202P for formation of p-type MBC transistors. The first region 202N may include a p-type well and the second region 202P may include an n-type well.

In embodiments represented in FIG. 2A, the workpiece 200 includes a fin-shaped active region 205a formed over the second region 202P of the substrate 202 and a fin-shaped active region 205b formed over the first region 202N of the substrate 202. It is understood that the workpiece 200 may include any suitable number of fin-shaped active regions. The fin-shaped active regions 205a-205b may be separately or collectively referred to as a fin-shaped active region 205 or fin-shaped active regions 205. Each of the fin-shaped active regions 205 has a width W1 along the Y direction. Each of the fin-shaped active regions 205 extends lengthwise along the X direction and is divided into channel regions 205C (shown in FIG. 2B) and sources/drain regions 205S/D (shown in FIG. 2B). The fin-shaped active region 205 may include a vertical stack of channel members in case of MBC transistors. In the embodiments represented in FIGS. 2A-2B, the semiconductor device 200 includes MBC transistors and each of the fin-shaped active regions 205 may be formed from a portion of the substrate 202 and a vertical stack 207 using a combination of lithography and etch steps. The vertical stack 207 includes a number of channel layers 208 interleaved by a number of sacrificial layers 206. In embodiments represented in FIGS. 2A-2B, the vertical stack 207 includes four sacrificial layers 206 interleaved by three channel layers 208. That is, the topmost sacrificial layer 206T is formed on the topmost channel layer 208. In some embodiments, a thickness of the topmost sacrificial layer 206T may be different than a thickness of the rest of the sacrificial layers 206. Each channel layer 208 may include a semiconductor material such as, silicon, germanium, silicon carbon, silicon germanium, or other suitable semiconductor materials, or combinations thereof, while each sacrificial layer 206 has a composition different from that of the channel layer 208. The channel layers 208 and the sacrificial layers 206 may be epitaxially deposited on the substrate 202 using molecular beam epitaxy (MBE), vapor-phase epitaxy (VPE), ultra-high vacuum CVD (UHV-CVD), and/or other suitable epitaxial growth processes. In this depicted example, the channel layer 208 is formed of silicon (Si) and the sacrificial layer 206 is formed of silicon germanium (SiGe).

In some other embodiments, each of the fin-shaped active regions 205 may be a fin structure and the semiconductor device 200 may include FinFETs. The fin-shaped active regions 205 may include silicon (Si) or another elementary semiconductor, such as germanium (Ge); a compound semiconductor such as silicon carbide (SiC), gallium arsenide (GaAs), gallium phosphide (GaP), indium phosphide (InP), indium arsenide (InAs), and/or indium antimonide (InSb); an alloy semiconductor such as silicon germanium (SiGe), gallium arsenic phosphorus (GaAsP), aluminum indium arsenic (AlInAs), aluminum gallium arsenic (AlGaAs), indium gallium arsenic (InGaAs), gallium indium phosphorus (GaInP), and/or gallium indium arsenic phosphorus (GaInAsP); or combinations thereof.

The workpiece 200 also includes a hard mask layer 210 formed on the fin-shaped active region 205 to protect the fin-shaped active region 205 during subsequent etching processes. The hard mask layer 210 may include any suitable material and may be a single-layer structure or a multi-layer structure. In embodiments represented in FIG. 2A, the hard mask layer 210 includes a first hard mask layer 210a formed on the fin-shaped active region 205 and a second hard mask layer 210b formed on the first hard mask layer 210a. A total thickness of the first hard mask layer 210a and the topmost sacrificial layer 206T may determine a thickness of a helmet layer 220 (shown in FIG. 6A). In an embodiment, the first hard mask layer 210a may include silicon nitride (SiN), the second hard mask layer 210b may include silicon oxide (SiO$_2$).

Still referring to FIG. 2A, the fin-shaped active regions 205a-205b are separated by an isolation structure 204. The isolation structure 204 may include silicon oxide, tetraethylorthosilicate (TEOS), doped silicon oxide (e.g., borophosphosilicate glass (BPSG), fluoride-doped silicate glass (FSG), phosphosilicate glass (PSG), boron-doped silicate glass (BSG), etc.), a low-k dielectric material (having a dielectric constant less than that of silicon oxide, which is about 3.9), other suitable materials, or combinations thereof. The isolation structure 204 may include shallow trench isolation (STI) features. In one embodiment, the isolation structure 204 is formed by filling trenches that separate the fin-shaped active regions 205 with a dielectric material described above by any suitable method, such as CVD, flowable CVD (FCVD), spin-on-glass (SOG), other suitable methods, or combinations thereof. The dielectric material may subsequently be planarized by a chemical-mechanical planarization/polishing (CMP) process and selectively etched back to form the isolation structure 204. After the etching back, a trench 212 is defined by the top surface of the isolation structure 204 and the sidewall surfaces of two adjacent fin-shaped active regions 205. The trench 212 spans a width S1 along the Y direction. That is, the separation distance between two adjacent fin-shaped active regions 205 may be referred to as S1. The isolation structure 204 may include a single-layer structure or a multi-layer structure. For example, the isolation structure 204 may include an oxide liner layer and a dielectric filler layer over the liner layer.

Referring to FIGS. 1, 3A and 3B, method 100 includes a block 104 where a cladding layer 214 is formed over the workpiece 200 to extend along sidewall surfaces of each fin-shaped active region 205. As shown in FIG. 3A, the cladding layer 214 partially fills the trench 212. In the present embodiments, the cladding layer 214 may have a composition that is substantially the same as that of the sacrificial layer 206, such that they may be selectively removed by a common etching process. In the present embodiment, the cladding layer 214 is formed of SiGe. In an embodiment, the cladding layer 214 may be formed by an amorphous SiGe deposition process and is formed on the top surface of the hard mask layer 210. In some embodiments, a thickness T1 of the cladding layer 214 may determine a thickness of the source/drain spacer 230b (shown in FIG. 13A).

Referring to FIGS. 1, 4A, and 4B, method 100 includes a block 106 where a dummy fin 216 is formed to substantially fill the trench 212. In some embodiments, the dummy fin 216 may be a single-layer structure. In some other embodiments, the dummy fin 216 may include a multi-layer structure. For example, as shown in FIG. 4A, the dummy fin 216 includes a second dielectric layer 216b embedded in a first dielectric layer 216a. The formation of the dummy fin 216 may include conformally depositing the first dielectric layer 216a over the workpiece 200 to partially fill the trench 212 by performing a deposition process such as a CVD process, a PVD process, an ALD process, or other suitable deposition process. The first dielectric layer 216a may include silicon nitride, silicon carbon nitride (SiCN), silicon oxycarbonitride (SiOCN), or other suitable materials. In an embodiment, the first dielectric layer 216a is formed of silicon carbon nitride. Subsequently, the second dielectric layer 216b is formed over the first dielectric layer 216a to substantially fill the trench 212. The second dielectric layer 216b may be deposited over the workpiece 200 using CVD, SACVD, FCVD, ALD, spin-on coating, and/or other suitable process and may include silicon oxide, silicon carbide, FSG, or other suitable low-k dielectric materials. In an embodiment, the second dielectric layer 216b is formed of silicon oxide. After the deposition of second dielectric layer 216b, a planarization process, such as a CMP process, may be performed to planarize the workpiece 200 to remove excess materials and expose a top surface of the cladding layer 214. The first dielectric layer 216a and the second dielectric layer 216b formed in the trench 212 may be collectively referred to as a dummy fin 216. As depicted herein, the dummy fin 216 is separated from each sidewall of the fin-shaped active region 205 by the cladding layer 214. The dummy fin 216 is configured to isolate adjacent fin-shaped active regions 205 and prevent the merge of source/drain features that will be formed in and over the adjacent fin-shaped active regions 205. In some implementations, the dummy fin 216 may further operate with a helmet layer to isolate two adjacent gate stacks or divide a gate stack into two pieces.

Figure 5B:
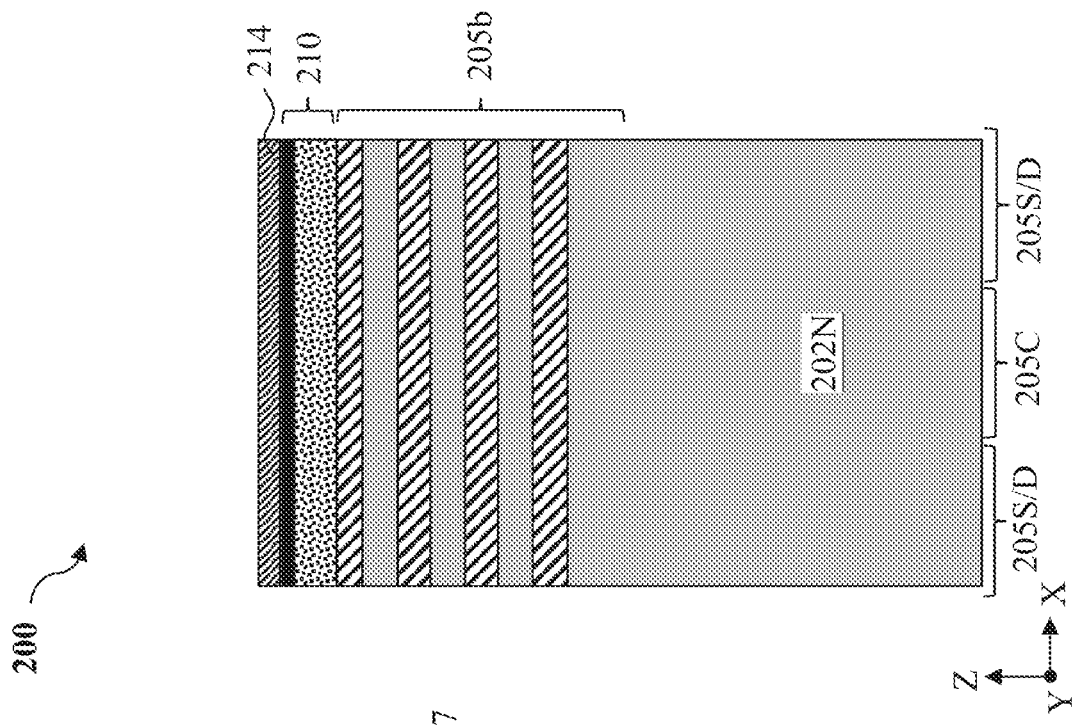
Figure 5A:
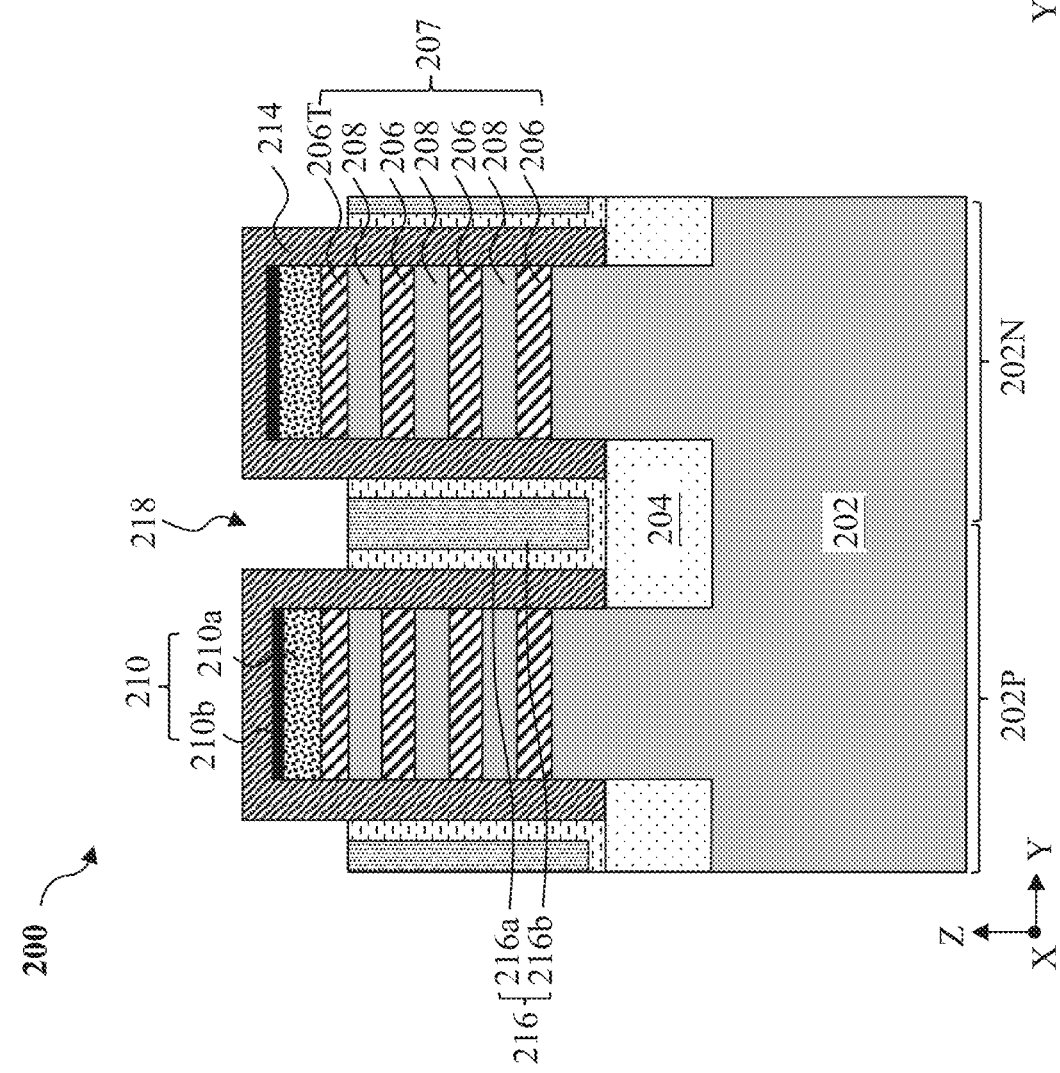

Referring to FIGS. 1, 5A and 5B, method 100 includes a block 108 where the dummy fin 216 is selectively recessed to form a trench 218 between two adjacent fin-shaped active regions 205 using an etching process. In some embodiments shown in FIG. 5A, after performing the etching process, a top surface of the recessed dummy fin 216 is substantially coplanar with the top surface of the topmost channel layer 208. The etching process may include any suitable process, such as a dry etching process, a wet etching process, other suitable processes, or combinations thereof.

Figures 6A, 6B:
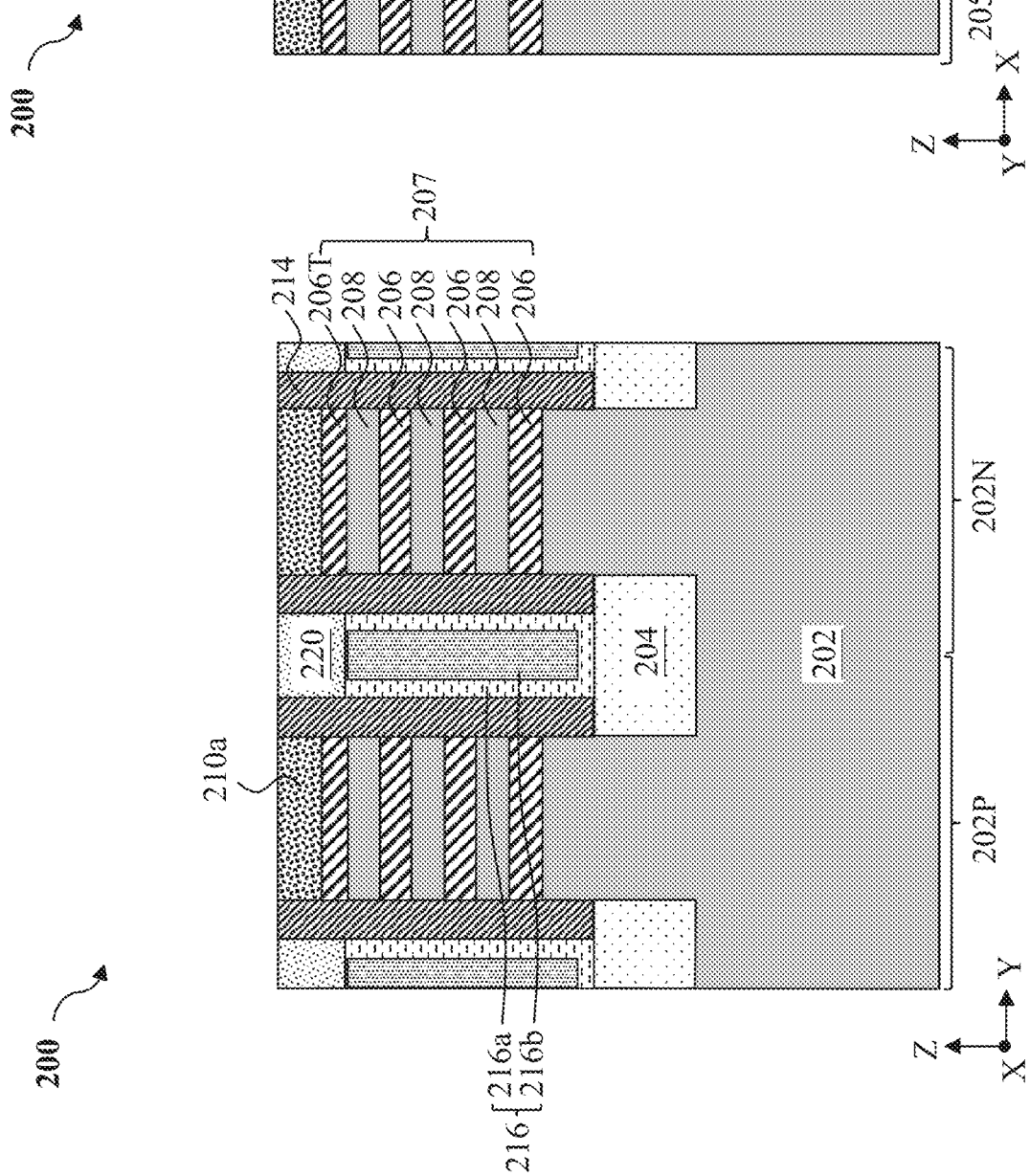

Referring to FIGS. 1, 6A and 6B, method 100 includes a block 110 where a helmet layer 220 is formed in the trench 218. The helmet layer 220 is deposited over the workpiece 200, thereby filling the trench 218. The helmet layer 220 may be a high-k dielectric layer and may include silicon nitride, aluminum oxide, aluminum nitride, aluminum oxynitride, zirconium oxide, zirconium nitride, zirconium aluminum oxide, hafnium oxide, other high-k material, or a suitable dielectric material. The helmet layer 220 may be deposited by a CVD process, an ALD process, a PVD process, and/or other suitable process. The workpiece 200 is then planarized using a CMP process to remove excess helmet layer 220 on the hard mask layer 210. In embodiments represented in FIG. 6A, the CMP process stops after removing the second hard mask layer 210b. In the present embodiment, the helmet layer 220 is configured to provide isolation for a to-be-formed gate stack 248 (shown in FIG. 17C) over the fin-shaped active region 205b and a to-be-formed gate stack 250 (shown in FIG. 17C) over the fin-shaped active region 205a. In some other examples, the helmet layer 220 may be configured to divide a gate stack into multiple portions. The helmet layer 220 may be referred to as a gate isolation feature or a gate cut feature. The dummy fin 216 and the helmet layer 220 may be collectively referred to as a hybrid fin.

Figure 7C:
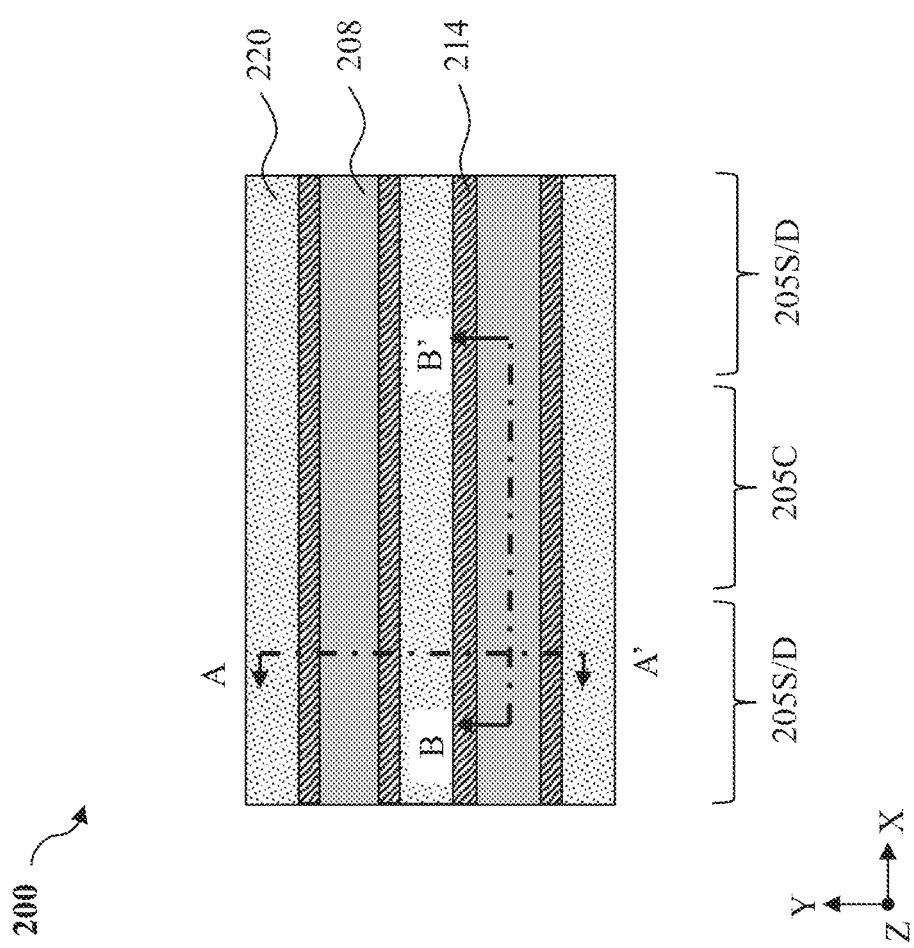
FIGS. 7C, 8C, 9C (FIGS. 7C-9C) and 13C illustrate fragmentary planar top views of a workpiece during various fabrication stages in the method of FIG. 1, according to various aspects of the disclosure.

Referring to FIGS. 1, 7A 7B, 7C (7A-7C), 8A, 8B, 8C, and 8D (8A-8D), method 100 includes a block 112 where a dummy gate structure 224 is formed over the channel regions 205C of the fin-shaped active regions 205. With reference to FIGS. 7A and 7B, the workpiece 200 is etched to selectively remove the topmost sacrificial layer 206T and a top portion of the cladding layer 214 that extends along the sidewall surfaces of the topmost sacrificial layer 206T to form a trench 222 without substantially etching the helmet layer 220 or the topmost channel layer 208. The trench 222 exposes the topmost channel layer 208. In some implementations, the etching process may include a selective dry etching process. In some implementations, the etching process may include a selective wet etching process (e.g., selective to SiGe) that includes ammonium hydroxide (NH$_4$OH), hydrogen fluoride (HF), hydrogen peroxide (H$_2$O$_2$), or a combination thereof. After the etching process, top surfaces of the cladding layer 214 and the topmost channel layer 208 are substantially coplanar. FIG. 7C depicts a fragmentary top view of the workpiece 200 shown in FIGS. 7A-7B. As shown in FIG. 7C, the cladding layer 214 extends lengthwise along the sidewall surface of the fin-shaped active region 205 orientated in the X direction.

Figure 8B:
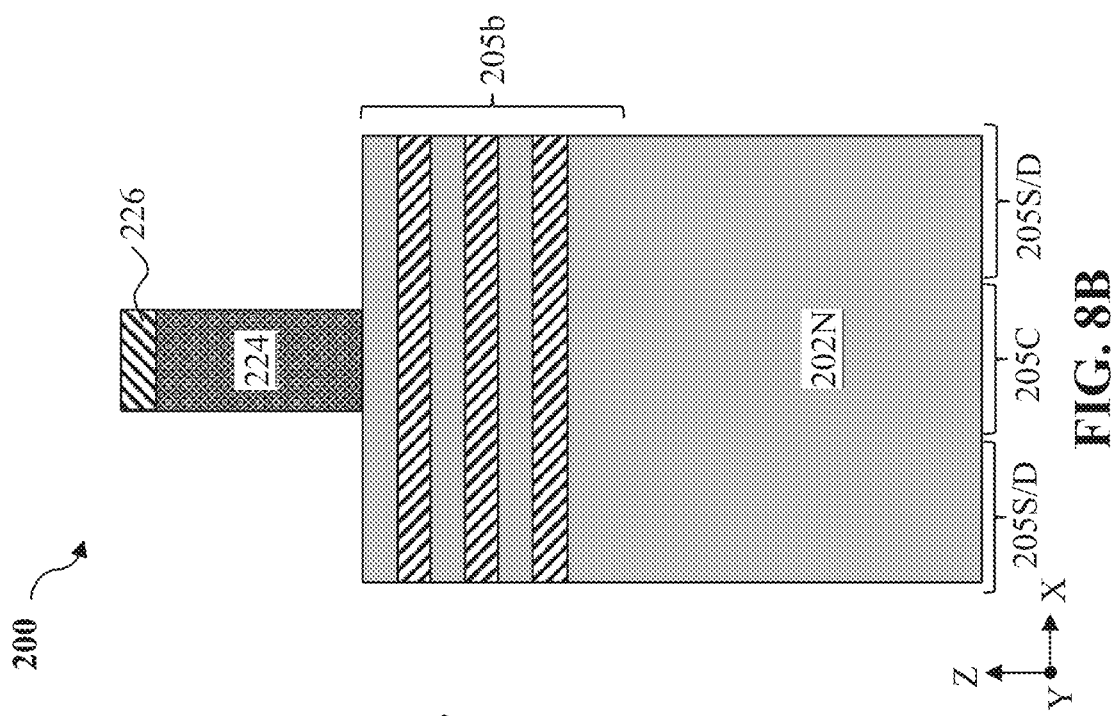
Figure 8A:
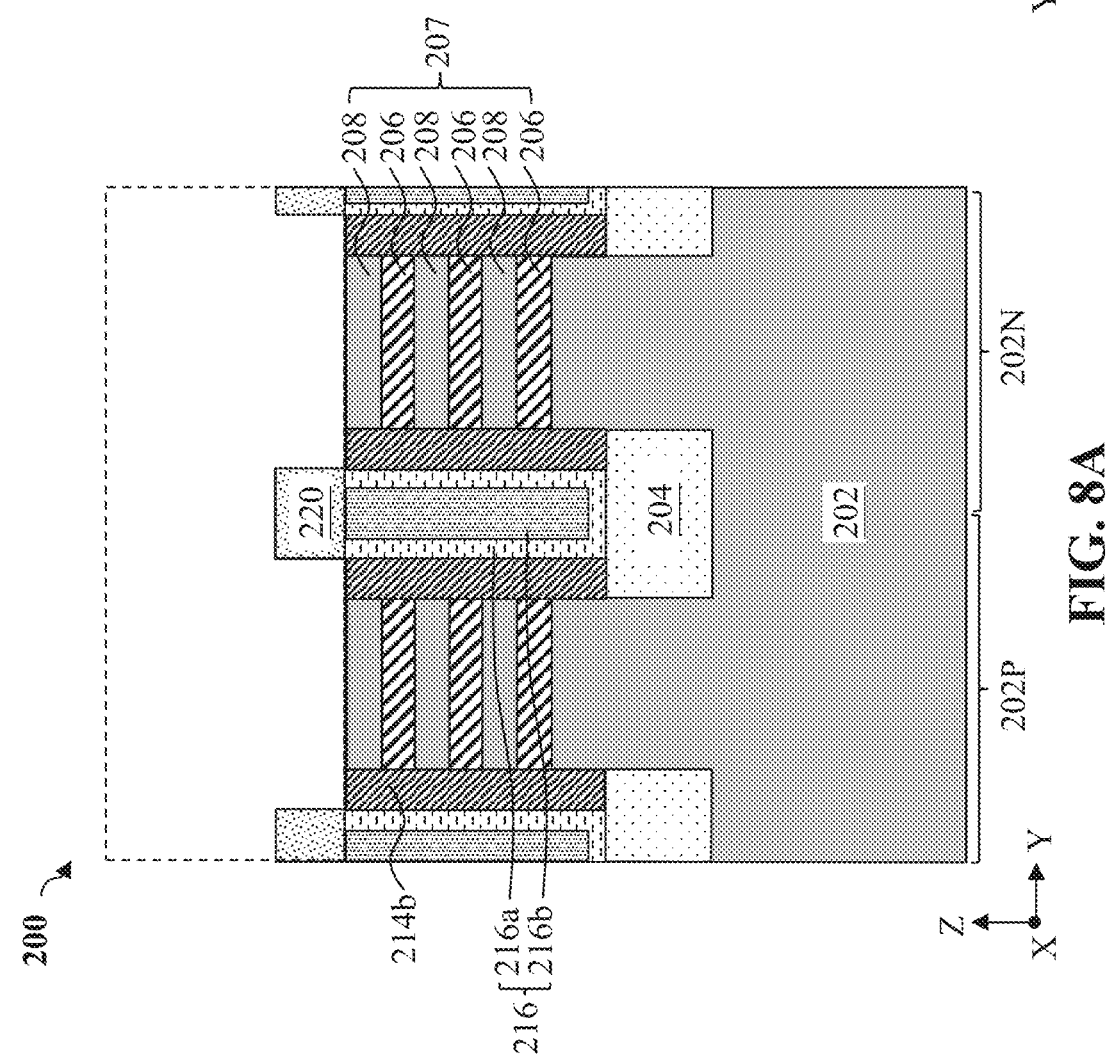
Figure 8D:
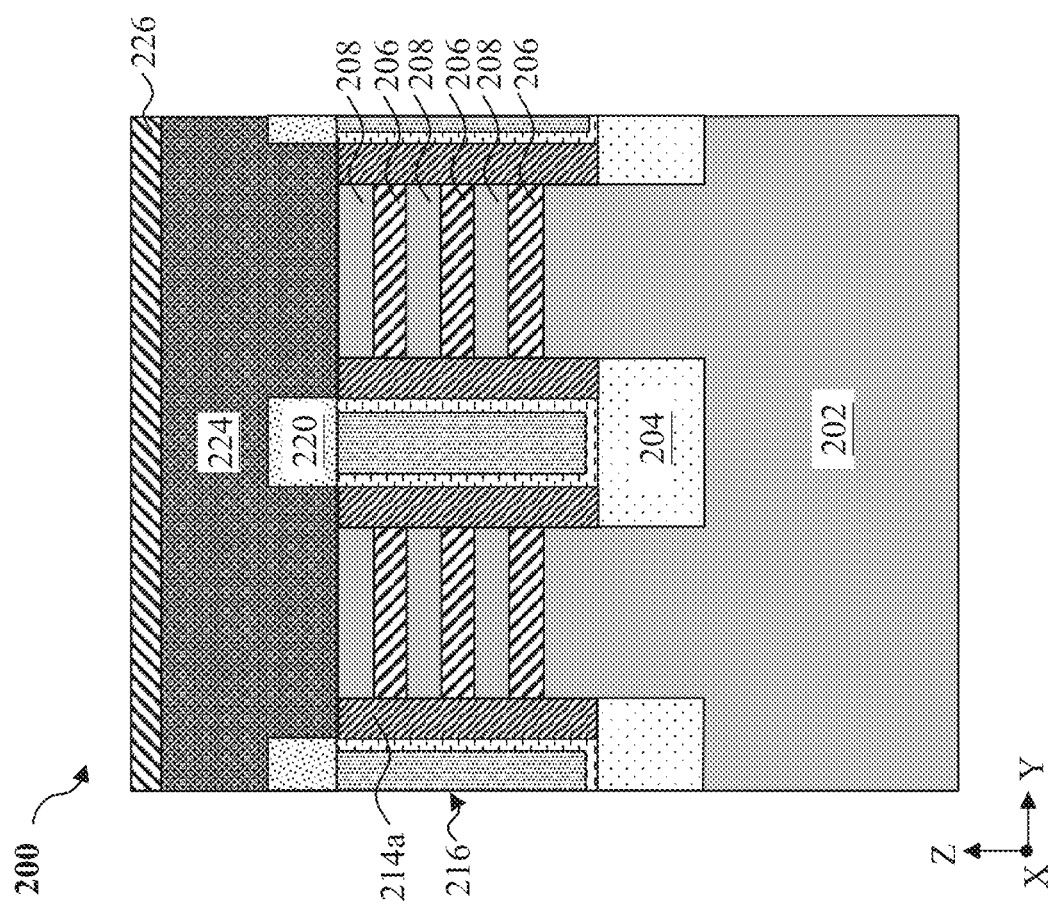
FIGS. 8D, 9D (FIGS. 8D-9D) and 17C illustrate fragmentary cross-sectional views of the workpiece taken along line D-D' shown in FIG. 8C during various fabrication stages in the method of FIG. 1, according to one or more aspects of the present disclosure.
Figure 8C:
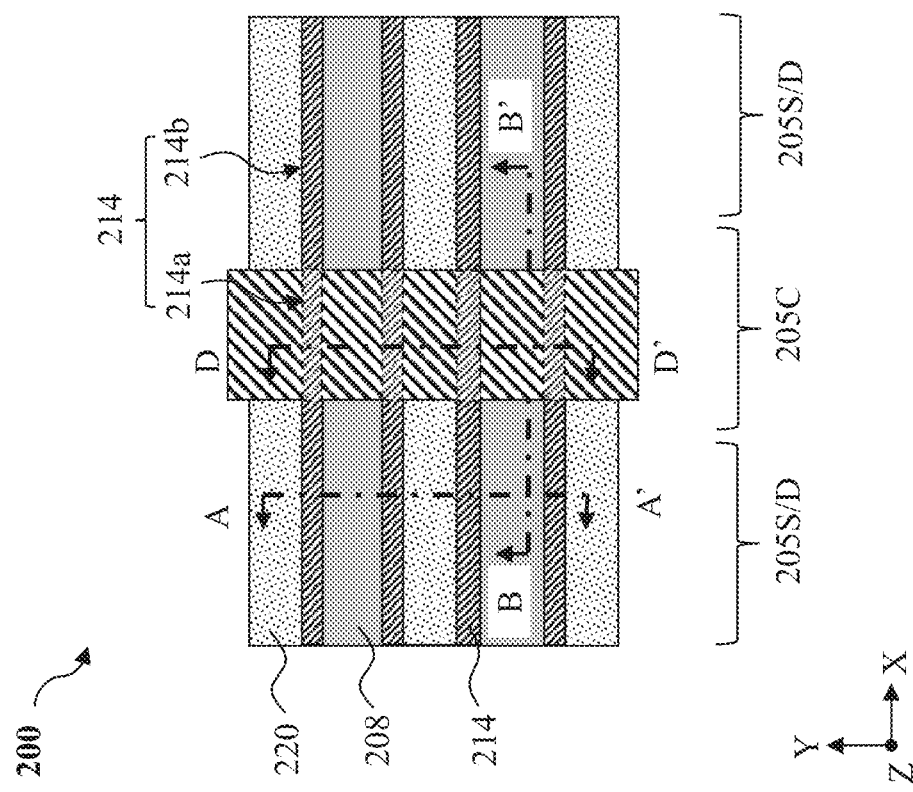

Subsequently, as shown in FIGS. 8A-8D, a dummy gate structure 224 is formed over the channel regions 205C of the fin-shaped active regions 205. FIG. 8C depicts a top view of the workpiece 200. FIG. 8A depicts a cross-sectional view of the workpiece 200 taken along line A-A' shown in FIG. 8C. FIG. 8B depicts a cross-sectional view of the workpiece 200 taken along line B-B' shown in FIG. 8C. FIG. 8D depicts a cross-sectional view of the workpiece 200 taken along line D-D' shown in FIG. 8C. In this embodiment, a gate replacement process (or gate-last process) is adopted where the dummy gate structure 224 serves as a placeholder for a functional gate stack (e.g., gate stack 248 or gate stack 250). Other processes and configurations are possible. While not explicitly shown, the dummy gate structure 224 may include a dummy dielectric layer and a dummy electrode disposed over the dummy dielectric layer. In some embodiments, the dummy dielectric layer may include silicon oxide and the dummy electrode may include polycrystalline silicon (polysilicon). As shown in FIG. 8B, the workpiece 200 also includes a gate-top hard mask layer 226 formed on the dummy gate structure 224. In some embodiments, the gate-top hard mask layer 226 may be a multi-layer structure. The dummy gate structure 224 and the gate-top hard mask layer 226 may be formed by one or more deposition processes, photolithography process, and/or etching processes. In embodiments represented in FIG. 8C, the cladding layer 214 includes a first portion 214a that is formed adjacent to the channel regions 205C of the fin-shaped active regions 205 and disposed directly under the dummy gate structure 224. The cladding layer 214 also includes a second portion 214b that is formed adjacent to the source/drain regions 205S/D of the fin-shaped active regions 205 and not covered by the dummy gate structure 224.

Figures 9A, 9B:
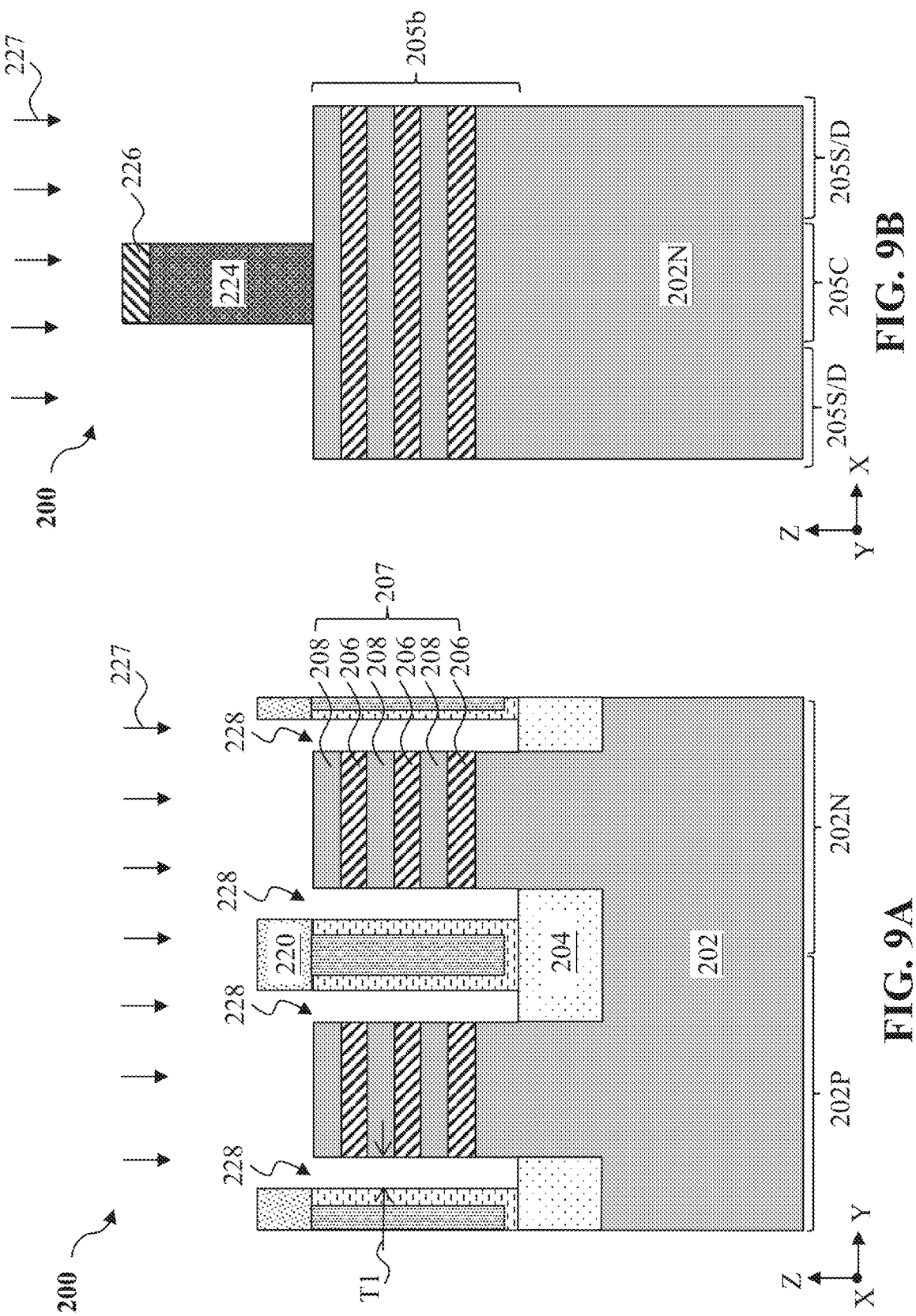
Figure 9D:
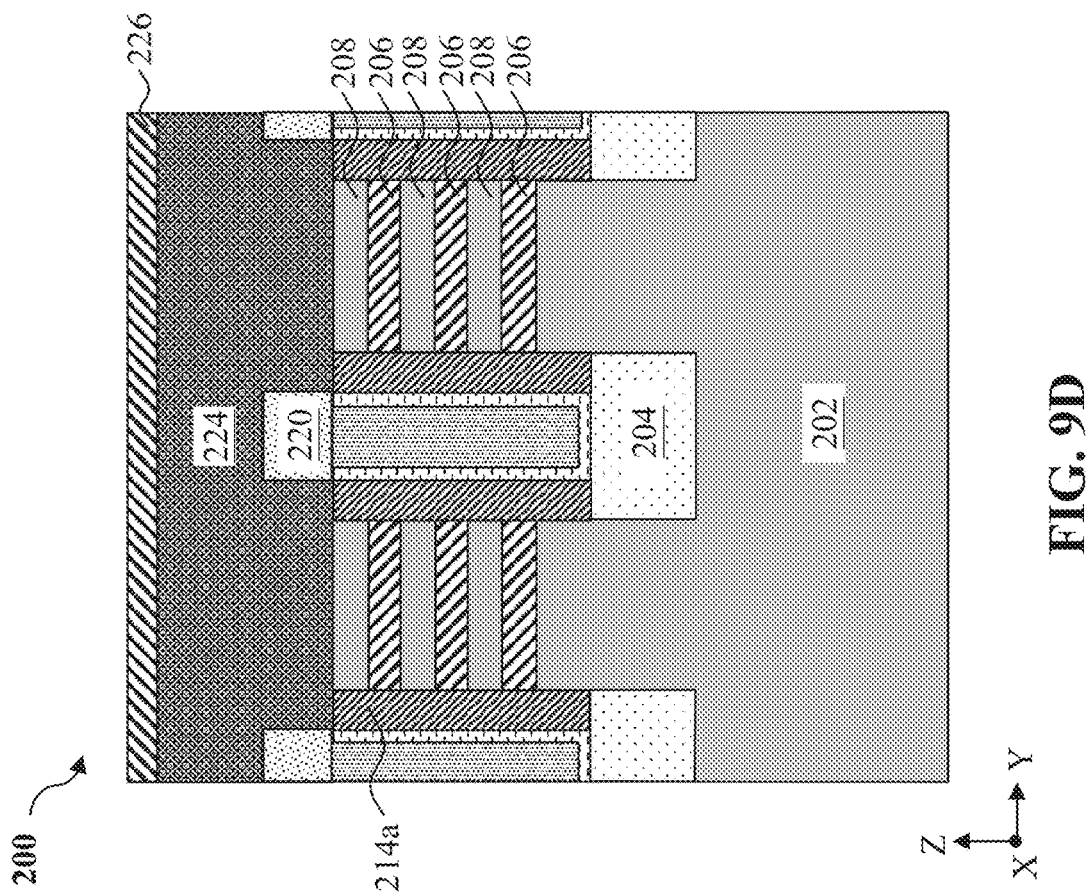
Figure 9C:
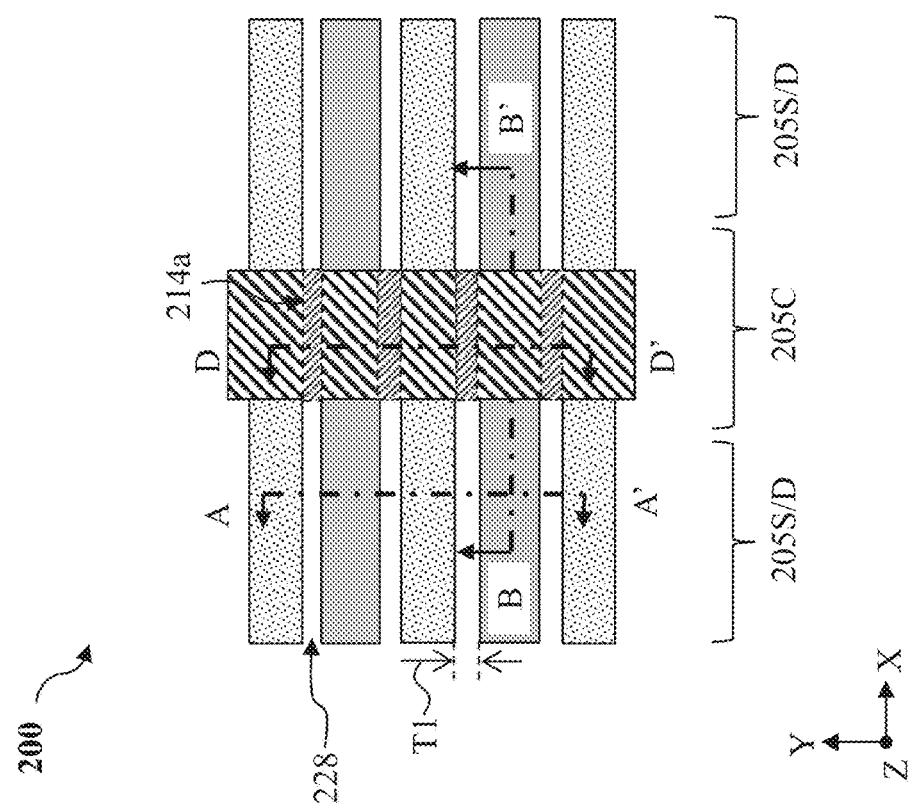

Referring to FIGS. 1, 9A, 9B, 9C, and 9D, method 100 includes a block 114 where the second portion 214b of the cladding layer 214 that is not covered by the dummy gate structure 224 is selectively removed by an etching process 227 to form trenches 228 (shown in FIGS. 9A and 9C) using the dummy gate structure 224 and the gate-top hard mask layer 226 as an etch mask. The first portion 214a of the cladding layer 214 that is covered by the dummy gate structure 224 and the gate-top hard mask layer 226 is kept substantially intact. FIG. 9C depicts a top view of the workpiece 200. FIG. 9A depicts a cross-sectional view of the workpiece 200 taken along line A-A' shown in FIG. 9C. FIG. 9B depicts a cross-sectional view of the workpiece 200 taken along line B-B' shown in FIG. 9C. FIG. 9D depicts a cross-sectional view of the workpiece 200 taken along line D-D' shown in FIG. 9C. As shown in FIG. 9A and FIG. 9C, after the removal of the second portion 214b of the cladding layer 214, the sidewall surfaces of the dummy fin 216 and the vertical stack 207 and a portion of the top surface of the STI structure 204 are exposed by the trenches 228. The trench 228 spans a width along the Y direction that is substantially equal to the thickness T1 (shown in FIG. 3A) of the cladding layer 214. The etching process 227 may be an anisotropic dry etching process that is configured to remove the second portion 214b of the cladding layer 214 without substantially etching the helmet layer 220, the dummy fin 216, the sacrificial layers 206 and the channel layers 208.

Referring to FIGS. 1, 10A, and 10B, method 100 includes a block 116 where a spacer layer 230 is deposited over the workpiece 200. After removing the second portion 214b of the cladding layer 214 and forming the trenches 228, the spacer layer 230 is deposited conformally over the workpiece 200, including over top surfaces of the gate-top hard mask layer 226, the helmet layer 220 and the fin-shaped active region 205 and sidewall surfaces of the dummy gate structure 224, the dummy fin 216 and the fin-shaped active regions 205. The term "conformally" may be used herein for ease of description of a layer having substantially uniform thickness over various regions. In embodiments represented in FIG. 10A, the spacer layer 230 substantially fills the trenches 228. That is, a deposition thickness T2 of the spacer layer 230 may be substantially equal to or greater than a half of the width T1 of the trench 228. Put differently, T2 is equal to or greater than 0.5*T1. The spacer layer 230 may be deposited over the workpiece 200 using processes such as CVD, atomic layer deposition (ALD), PVD, or other suitable process.

Dielectric materials for the spacer layer 230 may be selected to allow selective removal of the dummy gate structure 224 without substantially damaging the spacer layer 230, selective recess of the spacer layer 230 without substantially damaging the helmet layer 220 and the fin-shaped active region 205, and selective removal of the source/drain regions 205S/D of the fin-shaped active region 205 without substantially etching the spacer layer 230. Suitable dielectric materials may include silicon nitride, silicon oxycarbonitride, silicon carbonitride, silicon oxide, silicon oxycarbide, silicon carbide, silicon oxynitride, other low-k dielectric materials, and/or combinations thereof. In some embodiments, since the spacer layer 230 is in direct contact with the fin-shaped active regions 205, a material of the spacer layer 230 may be selected such that the to-be-formed source/drain spacers 230b (shown in FIG. 11A) may introduce strains to source/drain features (e.g., source/drain features 236N and 236P shown in FIG. 17A) that would be formed in and over the fin-shaped active regions 205, thereby increasing the carrier mobility of the workpiece 200. Exemplary strained materials may include nitride-based dielectric materials such as silicon nitride.

Figure 11B:
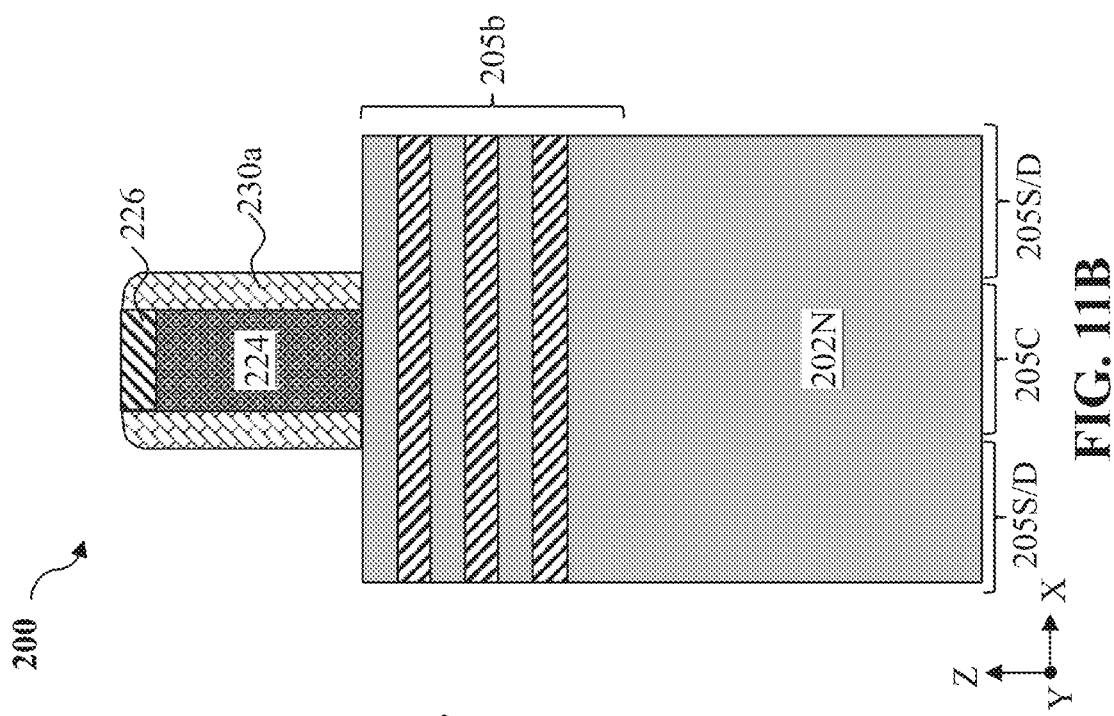
Figure 11A:
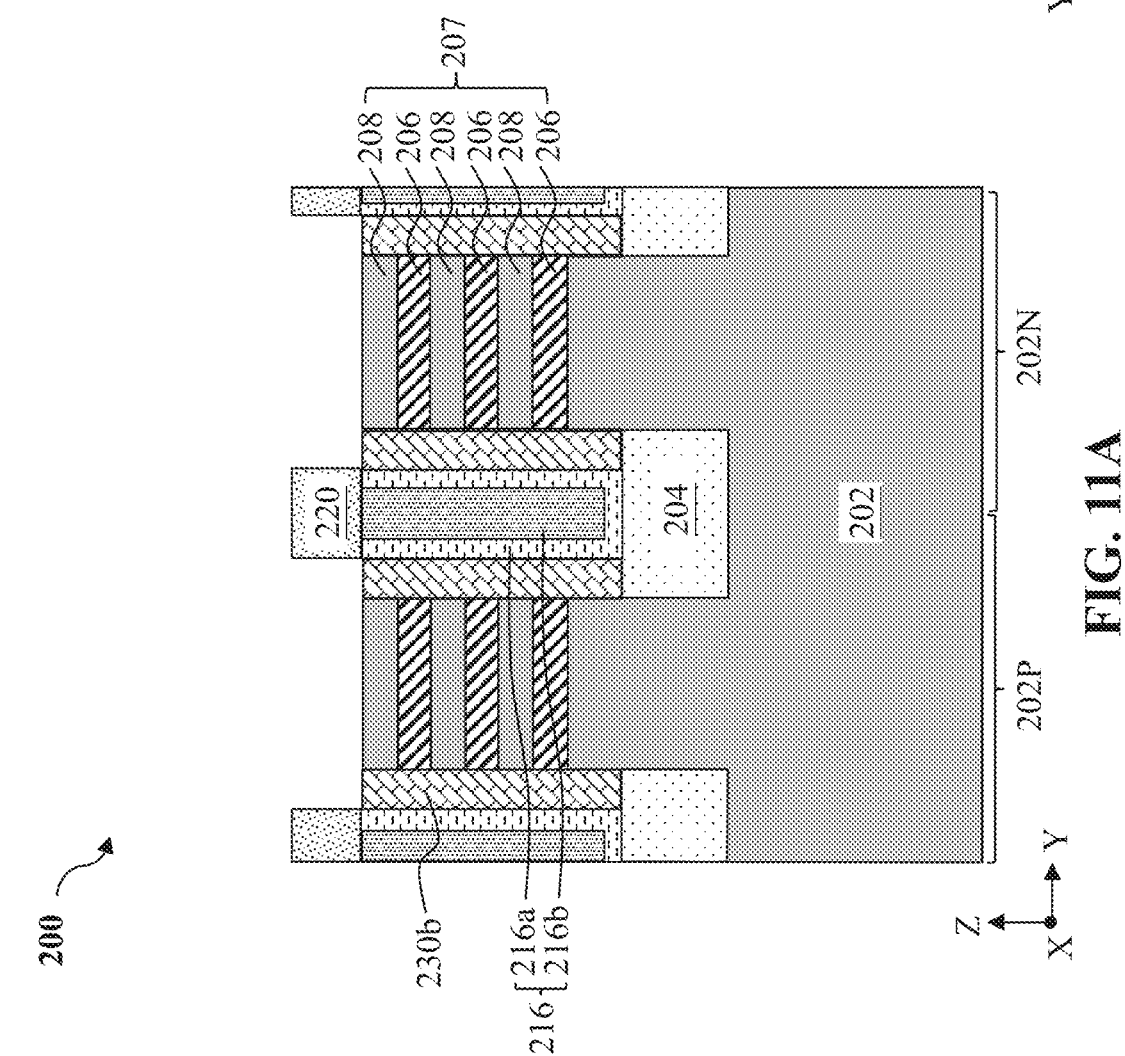

Referring to FIGS. 1, 11A, and 11B, method 100 includes a block 118 where the spacer layer 230 is etched back to form source/drain spacers 230b in the trenches 228 and gate spacers 230a along sidewall surfaces of the dummy gate structure 224. An anisotropic etching process may be performed to selectively remove portions of the spacer layer 230 that are not extending along sidewall surfaces of the fin-shaped active regions 205, the dummy fin 216, and the dummy gate structure 224, thereby forming source/drain spacers 230b in the trenches 228 and gate spacers 230a along sidewall surfaces of the dummy gate structure 224. The anisotropic etching process may include an anisotropic dry etching process. In the present embodiment, after the anisotropic etching process, a top surface of the source/drain spacer 230b is substantially coplanar with the top surface of the topmost channel layer 208. As shown in FIGS. 11A-11B, the source/drain spacer 230b is in direct contact with sidewall surfaces of both the dummy fin 216 and the fin-shaped active region 205. That is, the source/drain spacer 230b is laterally sandwiched between the fin-shaped active region 205 and the dummy fin 216 along the Y direction. The regions of the fin-shaped active regions 205 underlying the dummy gate structure 224 may be referred to as channel regions 205C. Each of the channel regions 205C in the fin-shaped active region 205 is sandwiched between two source/drain regions 205S/D.

Figure 12B:
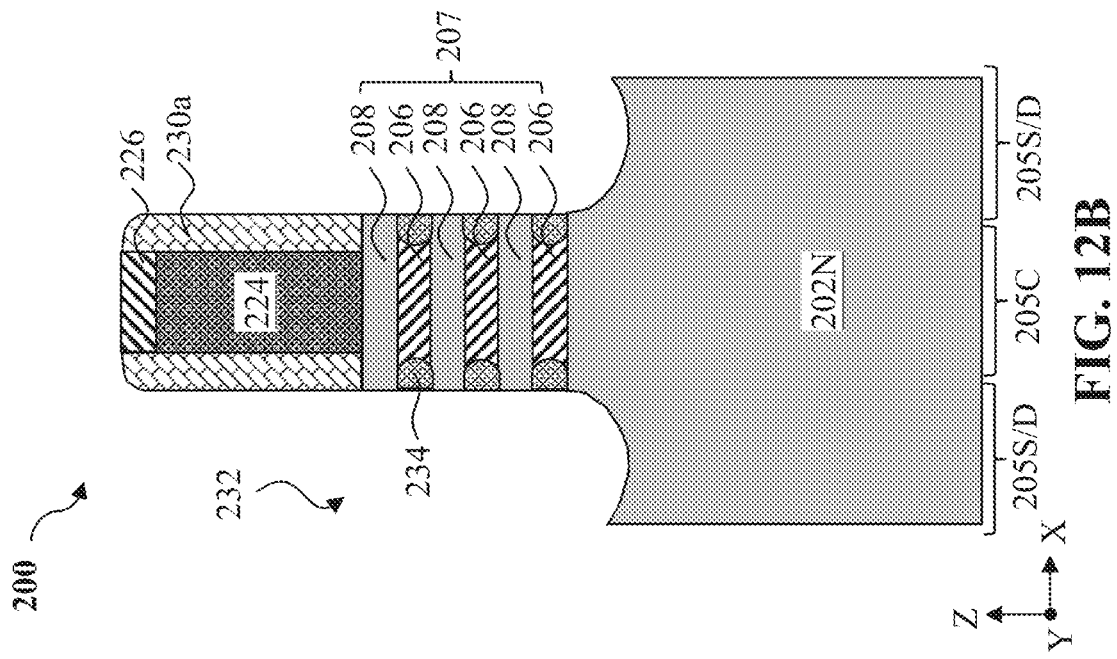
Figure 12A:
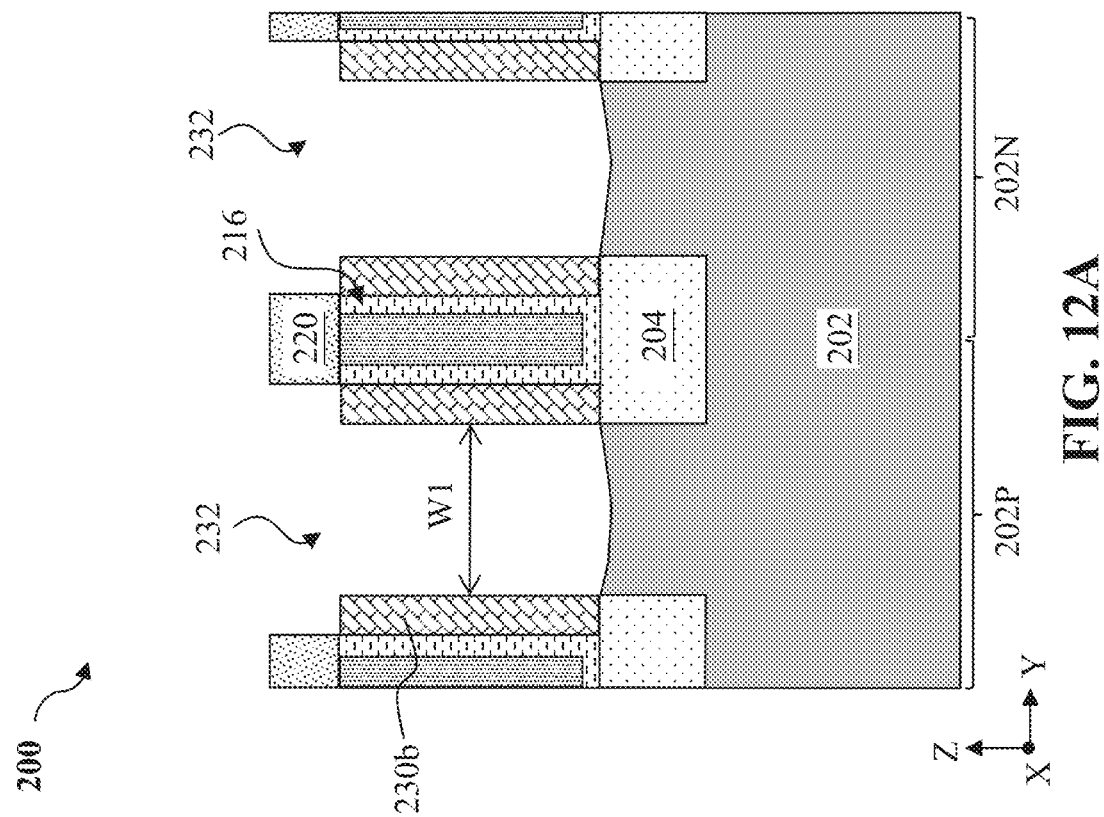

Referring to FIGS. 1, 12A, and 12B, method 100 includes a block 120 where source/drain regions 205S/D of the fin-shaped active regions 205 are selectively recessed to form source/drain trenches 232. With the gate-top hard mask layer 226, the gate spacers 230a, the source/drain spacers 230b, and the helmet layer 220 serving as an etch mask, the source/drain regions 205S/D of the fin-shaped active regions 205 are etched to form source/drain trenches 232 without substantially etching the helmet layer 220, the source/drain spacers 230b, the gate-top hard mask layer 226, and the gate spacers 230a. Source/drain trenches 232 may not only extend through the vertical stack 207, but also partially extend into the substrate 202. Due to the formation of the source/drain spacers 230b, a width of the source/drain trench 232 along the Y direction may be substantially equal to the width W1 of the fin-shaped active region 205.

Still referring to FIGS. 1, 12A, and 12B, method 100 includes a block 122 where inner spacer features 234 are formed. After forming the source/drain trenches 232, the sacrificial layers 206 exposed in the source/drain trenches 232 are selectively and partially recessed to form inner spacer recesses (filled by inner spacer features 234), while the exposed channel layers 208 are substantially unetched. In some embodiments, this selective recess may include a selective isotropic etching process (e.g., a selective dry etching process or a selective wet etching process), and the extent at which the sacrificial layers 206 is recessed is controlled by duration of the etching process. After the formation of the inner spacer recesses, an inner spacer material layer is then conformally deposited using CVD or ALD over the workpiece 200, including over and into the inner spacer recesses. The inner spacer material may include silicon nitride, silicon oxycarbonitride, silicon carbonitride, silicon oxide, silicon oxycarbide, silicon carbide, or silicon oxynitride. The inner spacer material layer is then etched back to form inner spacer features 234, as illustrated in FIG. 12B. In some embodiments, a composition of the inner spacer features 234 is different than a composition of the gate spacers 230a and the source/drain spacers 230b such that the etching back of the inner spacer material layer does not substantially etch the gate spacers 230a and the source/drain spacers 230b.

Referring to FIGS. 1, 13A, 13B, and 13C, method 100 includes a block 124 where N-type source/drain features 236N are epitaxially formed in the corresponding source/drain trenches 232 over the first region 202N and P-type source/drain features 236P are epitaxially formed in the corresponding source/drain trenches 232 over the second region 202P by using one or more epitaxial processes, such as VPE, UHV-CVD, MBE, and/or other suitable processes. The source/drain features 236N and/or 236P are therefore coupled to the corresponding channel layers 208 in the channel regions 205C of the respective fin-shaped active regions 205. As exemplary shown in FIG. 13A, two adjacent source/drain features (e.g., the N-type source/drain feature 236N and the P-type source/drain feature 236P) are separated by the combination of the dummy fin 216 and the source/drain spacers 230b. That is, by forming the source/ drain spacers 230b, a distance W2 between the N-type source/drain feature 236N and the P-type source/drain feature 236P may be increased compared to embodiments where the source/drain features are separated only by the dummy fin 216. In an embodiment, the distance W2 is substantially equal to the separation distance S1 (shown in FIG. 2A) between two adjacent fin-shaped active regions 205 and is greater than a width of the dummy fin 216 along the Y direction. In some embodiments, the distance W2 may be between about 10 nm and about 45 nm. By increasing the distance W2 between the N-type source/drain feature 236N and the P-type source/drain feature 236P, the possibility of the merge of the N-type source/drain feature 236N with the P-type source/drain feature 236P is reduced, and the possibility of the unintentional electrical shorting may be also reduced. In some embodiments, since the lateral growth of the epitaxial source/drain features 236N/236P are confined by the source/drain spacers 230b rather than the dummy fin 216, the width of the dummy fin 216 may be reduced and thus the separation distance S1 between two adjacent fin-shaped active regions 205 may be reduced, thereby increasing the density of fin-shaped active regions 205 on the substrate 202 and increasing the density of transistors.

Figure 13B:
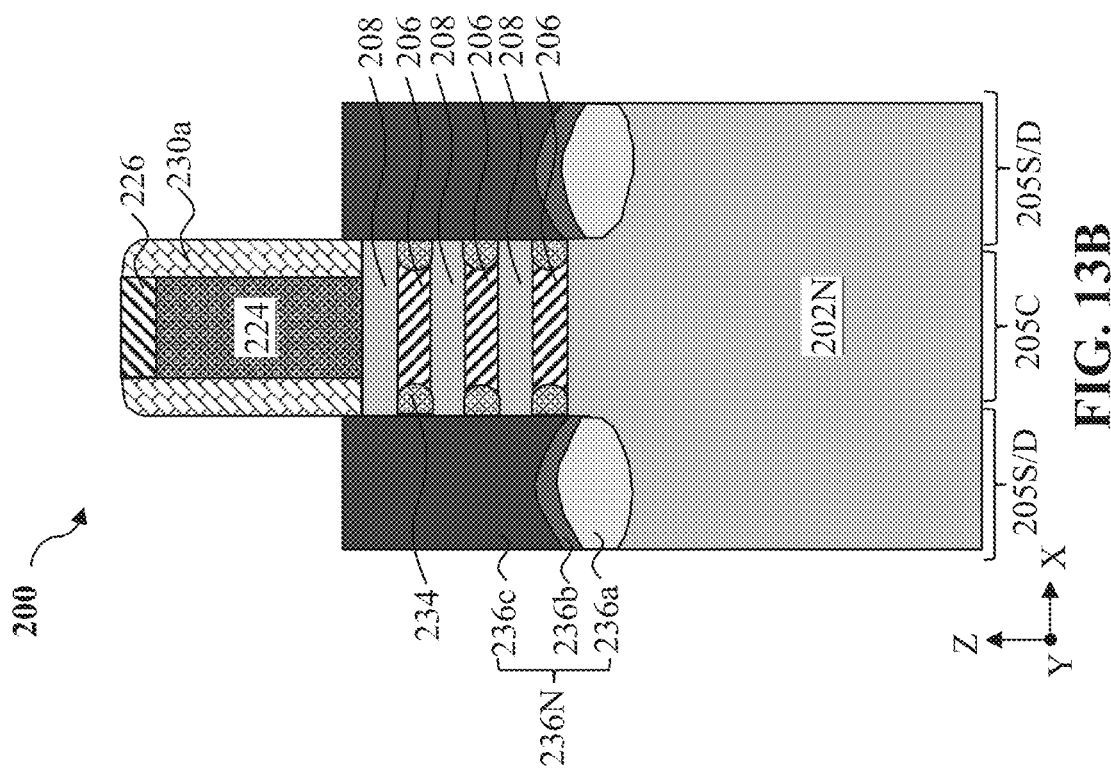
Figure 13A:
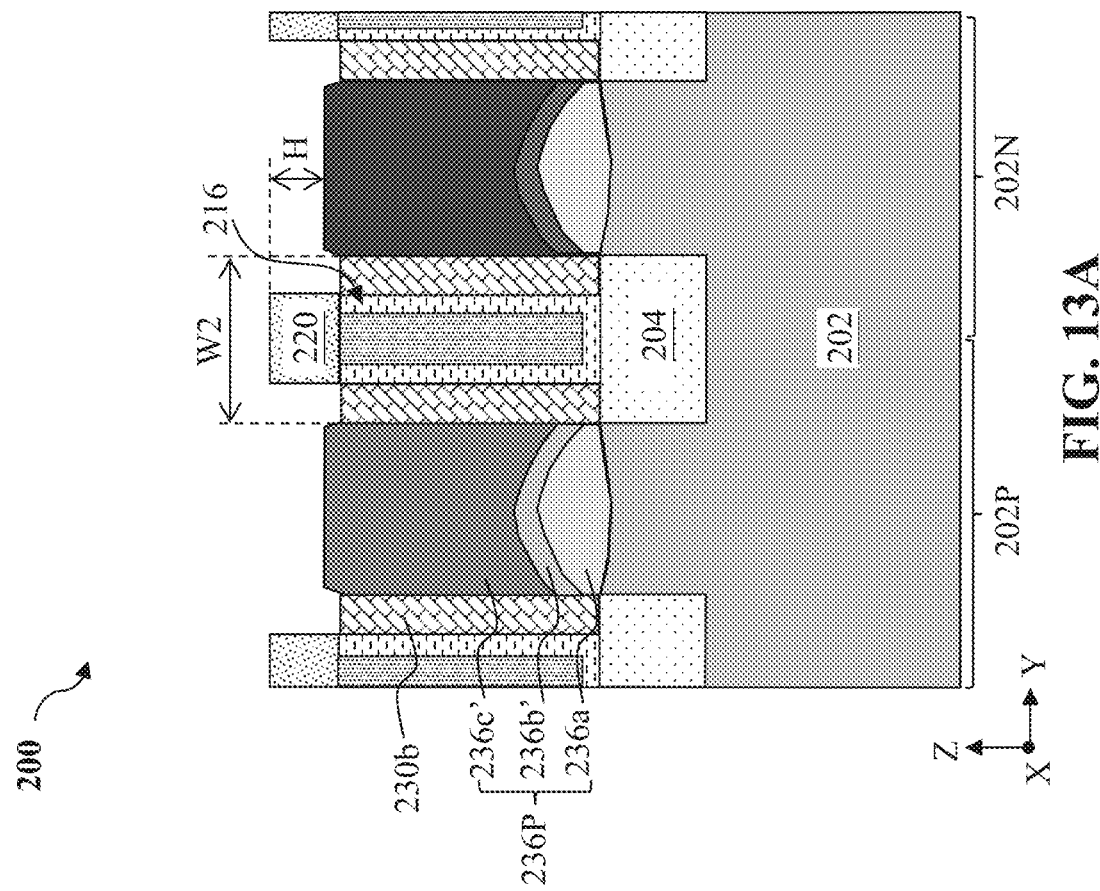

In embodiments represented in FIG. 13A and FIG. 13B, the N-type source/drain feature 236N and the P-type source/drain feature 236P each includes a first semiconductor layer 236a formed over top surfaces of the substrate 202 exposed in the source/drain trenches 232 by using an epitaxial process. In embodiments represented in FIG. 13A, the first semiconductor layer 236a is in direct contact with a sidewall surface of the source/drain spacer 230b. The first semiconductor layer 236a may be undoped or not intentionally doped and may be configured to reduce leakage through the substrate 202. In some embodiments, the first semiconductor layer 236a may include undoped silicon (Si), undoped germanium (Ge), undoped silicon germanium (SiGe), or other suitable materials.

The N-type source/drain feature 236N and the P-type source/drain feature 236P each also includes a corresponding second semiconductor layer 236b and second semiconductor layer 236b' formed over top surfaces of the first semiconductor layer 236a, respectively. Compositions of the second semiconductor layers 236b and 236b' are different than a composition of the first semiconductor layer 236a. More specifically, the second semiconductor layers 236b of the N-type source/drain feature 236N may include arsenic-doped silicon (Si:As), phosphorus-doped silicon (Si:P), arsenic-doped silicon carbide (SiC:As), phosphorus-doped silicon carbide (SiC:P) or other suitable materials, and have a dopant concentration greater than that of the undoped first semiconductor layer 236a. The second semiconductor layers 236b' of the P-type source/drain feature 236P may include boron-doped silicon germanium (SiGe:B) or other suitable materials, and have a dopant concentration greater than that of the undoped first semiconductor layer 236a. In some embodiments, the second semiconductor layers 236b and 236b' may be selectively grown from semiconductor surfaces exposed in the source/drain trenches 232 by using an epitaxial process. The epitaxial process may use gaseous and/or liquid precursors, which interact with the composition of the first semiconductor layer 236a. In some implementations, the second semiconductor layers 236b and 236b' each may include a bottom segment on the first semiconductor layer 236a and multiple sidewall segments on the sidewall surfaces of the channel layers 208, thereby partially filling the source/drain trenches 232. In embodiments represented in FIG. 13A, the bottom segments of the second semiconductor layers 236b and 236b' are in direct contact with sidewall surfaces of the source/drain spacers 230b.

The N-type source/drain feature 236N and the P-type source/drain feature 236P may each include a corresponding third semiconductor layer 236c and third semiconductor layer 236c' formed over the second semiconductor layers 236b and the second semiconductor layers 236b', respectively, to fill the corresponding source/drain trenches 232. The third semiconductor layers 236c-236c' may be formed in the source/drain trenches 232 by using an epitaxial process, such as VPE, UHV-CVD, MBE, and/or other suitable processes. A material of the third semiconductor layer 236c may be the same as or different than a material of the second semiconductor layers 236b, and a material of the third semiconductor layer 236c' may be the same as or different than a material of the second semiconductor layers 236b', a dopant concentration of the third semiconductor layer 236c is greater than that of the second semiconductor layers 236b, and a dopant concentration of the third semiconductor layer 236c' is greater than that of the second semiconductor layers 236b'. In some embodiments, the third semiconductor layer 236c and the third semiconductor layer 236c' are heavily doped semiconductor layers. The third semiconductor layer 236c of the N-type source/drain feature 236N may include arsenic-doped silicon (Si:As), phosphorus-doped silicon (Si:P), arsenic-doped silicon carbide (SiC:As), phosphorus-doped silicon carbide (SiC:P) or other suitable materials. The third semiconductor layer 236c' of the P-type source/drain feature 236P may include boron-doped silicon germanium (SiGe:B) or other suitable materials. In embodiments represented in FIG. 13A, the third semiconductor layer 236c and 236c' are in direct contact with sidewall surfaces of the source/drain spacers 230b. That is, in embodiments represented in FIG. 13A, the first, second, and third semiconductor layers of the source/drain feature 236N/236P are all in direct contact with the source/drain spacers 230b.

Figure 13C:
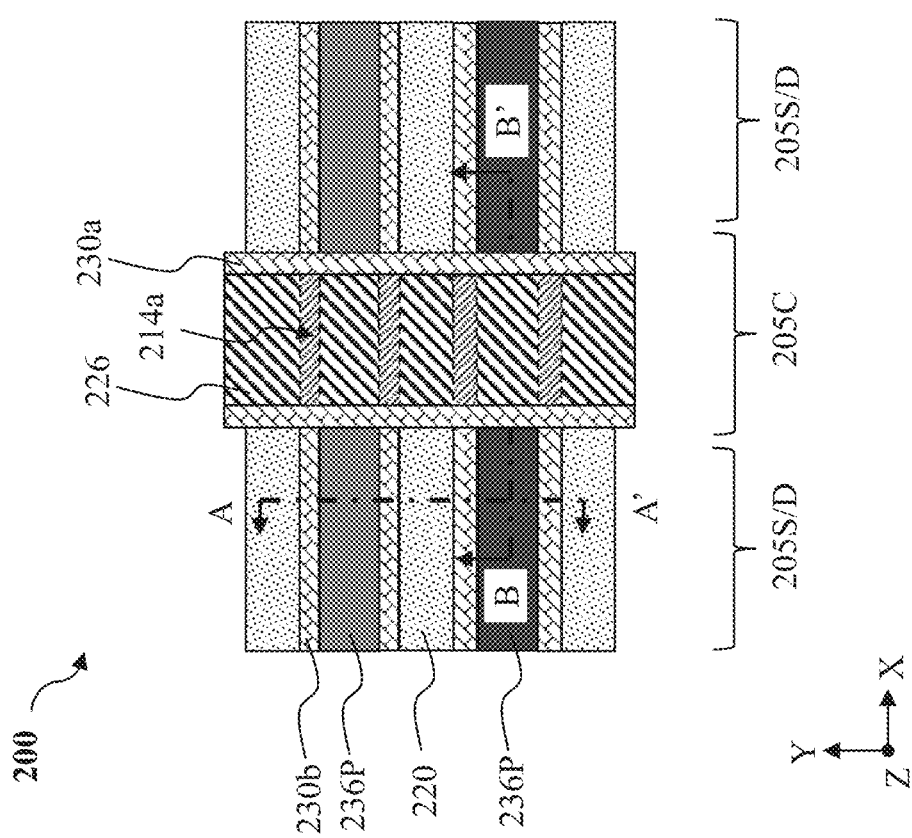

In embodiments represented in FIG. 13A, a top surface of the source/drain feature (e.g., the N-type source/drain feature 236N and/or the P-type source/drain feature 236P) is substantially coplanar with a top surface of the source/drain spacers 230b. It is further noted that, as shown in FIG. 13A and FIG. 13C, the lateral growth of the source/drain feature 236N/236P along the Y direction is confined by the source/drain spacers 230b. As such, the source/drain feature 236N/236P has a uniform width substantially equal to the width W1 of the fin-shaped active region 205 bottom to up and when viewed from the X direction, the sidewalls of the source/drain feature 236N/236P are substantially vertical. In some other implementations, a top surface of the source/drain feature 236N/236P may be above a top surface of the source/drain spacers 230b and below a top surface of the helmet layer 220. A distance H between the top surface of the source/drain feature 236N/236P and a top surface of the helmet layer 220 may be less than about 20 nm.

Referring to FIGS. 1, 14A, 14B, 15A, and 15B, method 100 includes a block 126 where the dummy gate structure 224, the first portion 214a of the cladding layer 214, and the sacrificial layers 206 are selectively removed. As shown in FIGS. 14A-14B, a contact etch stop layer (CESL) 240 and an interlayer dielectric (ILD) layer 242 are deposited over the workpiece 200. The CESL 240 may include silicon nitride, silicon oxynitride, and/or other suitable materials and may be formed by ALD, plasma-enhanced chemical vapor deposition (PECVD) process and/or other suitable deposition or oxidation processes. As shown in FIGS. 14A-14B, the CESL 240 may be deposited on top surfaces of the source/drain features 236N/236P, the source/drain spacers 230b and the helmet layer 220, and sidewall surfaces of the gate spacers 230a and the helmet layer 220. The ILD layer 242 may be deposited by a PECVD process, FCVD, or other suitable deposition technique over the workpiece 200 after the deposition of the CESL 240. The ILD layer 242 may include materials similar to that of the isolation structures 204. A planarization process may be then performed to remove excess materials such as removing the gate-top hard mask layer 226 on the dummy gate structure 224 and portions of the CESL 240 and the ILD layer 242 over the gate-top hard mask layer 226.

Figure 15B:
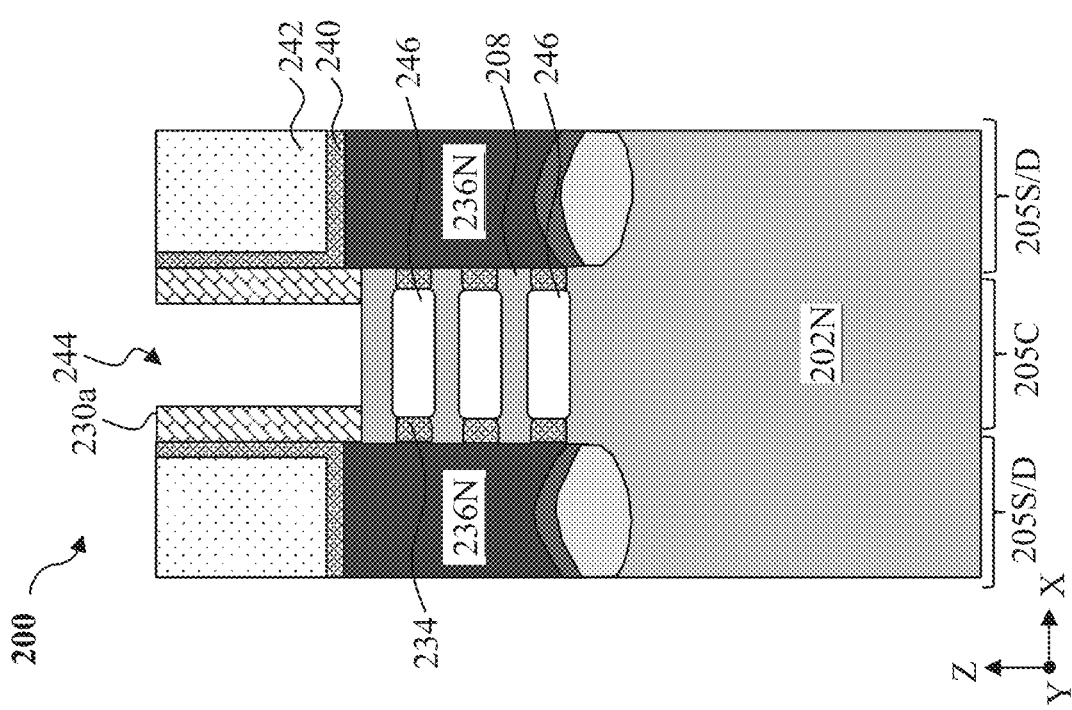
Figure 15A:
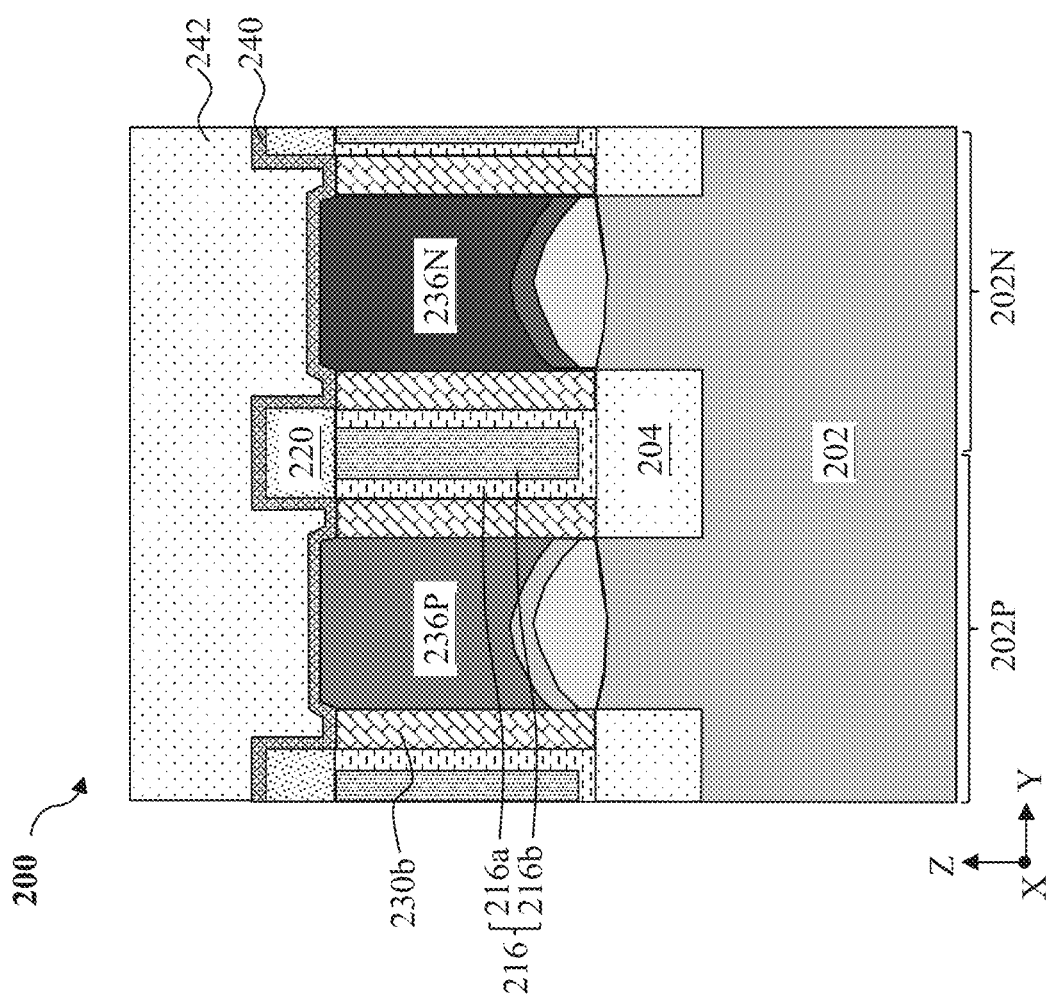

Subsequently, referring to FIGS. 15A-15B, the dummy gate structure 224 is selectively removed by an etching process. The removal of the dummy gate structure 224 forms gate trenches 244 over the channel regions 205C. Although not shown, it is understood that the gate trenches 244 expose the first portion 214a of the cladding layer 214 that was covered by the dummy gate structure 224. The etching process for removing the dummy gate structure 224 may include any suitable process, such as a dry etching process, a wet etching process, or combinations thereof, and is configured to selectively remove the dummy gate structure 224 without substantially etching the channel layers 208, the gate spacer 230a, the helmet layer 220, the dummy fin 216, the CESL 240, and the ILD layer 242.

After the selective removal of the dummy gate structure 224, without substantially removing the channel layers 208, one or more etching processes may be performed to selectively remove the first portion 214a of the cladding layer 214 and the sacrificial layers 206 to release the channel layers 208 as channel members 208. Since the composition of the cladding layer 214 is the same as the composition of the sacrificial layers 206, the first portion 214a of the cladding layer 214 and the sacrificial layers 206 may be removed by a common etching process. In one example, the etching process for removing the sacrificial layers 206 may be a wet etching process that employs an oxidant such as ammonium hydroxide ($NH_4OH$), ozone ($O_3$), nitric acid ($HNO_3$), hydrogen peroxide ($H_2O_2$), other suitable oxidants, and a fluorine-based etchant such as hydrofluoric acid (HF), ammonium fluoride ($NH_4F$), other suitable etchants, or combinations thereof. The removal of the sacrificial layers 206 forms a number of openings 246. Although not shown, it is understood that the removal of the first portion 214a of the cladding layer 214 would form a trench disposed between the stack of channel members 208 and the dummy fin 216.

Figure 16B:
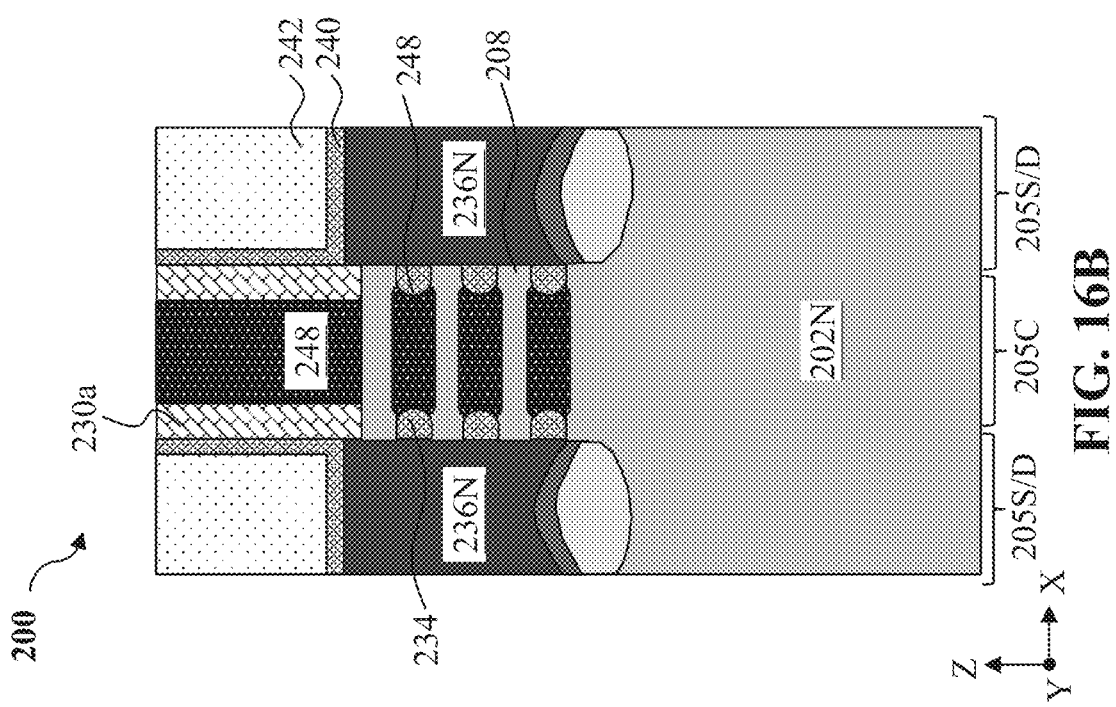
Figure 16A:
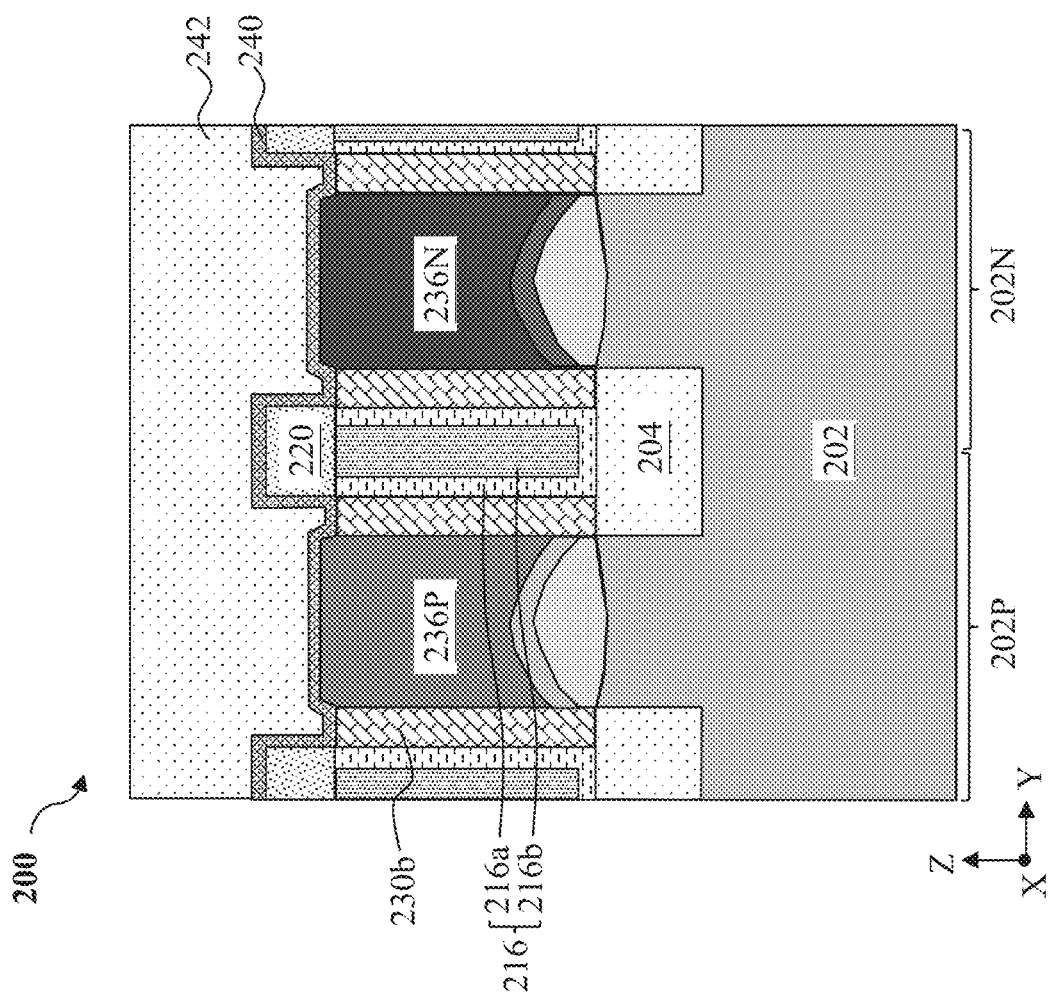

Referring to FIGS. 1, 16A, and 16B, method 100 includes a block 128 where a gate stack 248 is formed over the first region 202N of the substrate 202 and a gate stack 250 (shown in FIG. 17C) is formed over the second region 202P of the substrate 202 to fill the gate trenches 244 and the openings 246 and wrap around each of the channel members 208. The gate stacks 248 and 250 each may include an interfacial layer (not separately labeled), a gate dielectric layer (not separately labeled) over the interfacial layer, and a corresponding gate electrode layer (not separately labeled) over the gate dielectric layer. In some embodiments, the interfacial layer may include silicon oxide formed by thermal oxidation. The gate dielectric layer is then deposited over the interfacial layer using ALD, CVD, and/or other suitable methods. The gate dielectric layer may include high-k dielectric materials. As used herein, high-k dielectric materials include dielectric materials having a high dielectric constant, for example, greater than that of thermal silicon oxide (~3.9). In one embodiment, the gate dielectric layer may include hafnium oxide. Alternatively, the gate dielectric layer may include other high-k dielectrics, such as titanium oxide ($TiO_2$), hafnium zirconium oxide (HfZrO), tantalum oxide ($Ta_2O_5$), hafnium silicon oxide ($HfSiO_4$), zirconium oxide, zirconium silicon oxide ($ZrSiO_2$), lanthanum oxide ($La_2O_3$), aluminum oxide ($Al_2O_3$), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)$TiO_3$ (BST), silicon nitride (SiN), silicon oxynitride (SiON), combinations thereof, or other suitable materials.

A gate electrode layer is deposited over the gate dielectric layer. The gate electrode layer may be a multi-layer structure that includes at least one work function layer and a metal fill layer. By way of example, the at least one work function layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC). The metal fill layer may include aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or a combination thereof. It is understood that the gate stack 248 and the gate stack 250 may include different work function layers. In various embodiments, the gate electrode layer may be formed by ALD, PVD, CVD, e-beam evaporation, or other suitable process. In various embodiments, a planarization process, such as a CMP process, may be performed to remove excess portions of those materials to provide a substantially planar top surface of the gate stack 248/250. The planarization process may stop when it reaches or before reaching the top surface of the helmet layer 220. In some embodiments, due to the formation of the source/drain spacers 230b, the lateral growth of the source/drain features 236N/236P along the Y direction is confined, leading to a reduced overlapping area between the source/drain feature 236N/236P and the gate stack 248/250. In this regard, the reduction in the overlapping area lowers the parasitic gate-drain capacitance ($C_{gd}$) of the MBC transistor, thereby reducing RC delay and increasing processing speed the MBC transistor when applied in alternating current (AC) settings.

Figure 17C:
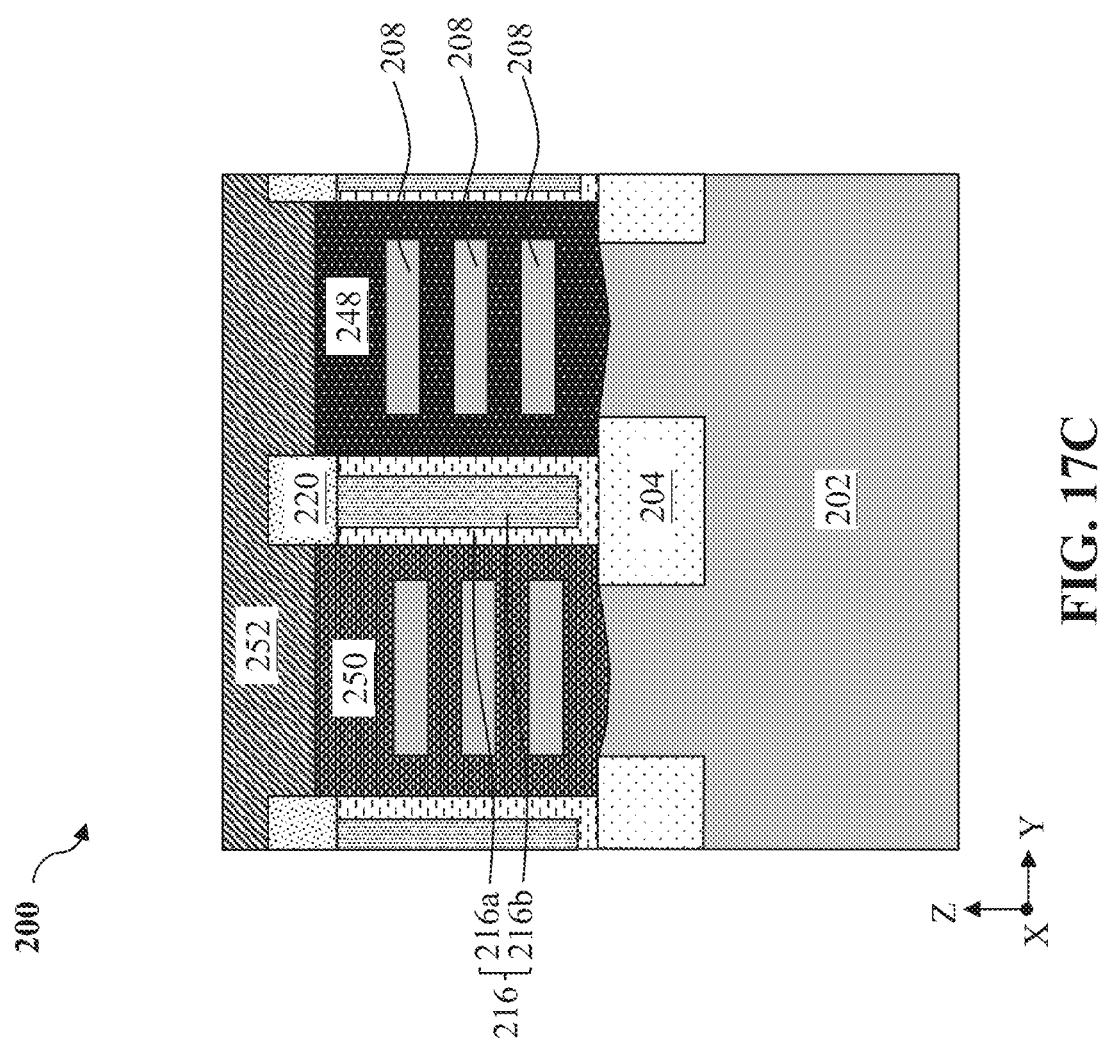

Referring to FIGS. 1, 17A, 17B, and 17C, method 100 includes a block 130 where further processes may be performed to complete the fabrication of the semiconductor device 200. Such further processes may include, for example, as shown in FIGS. 17A-17B, performing an etching process to selectively recess the gate stack (e.g., the gate stack 248) until a portion of the helmet layer 220 protrudes from a top surface of the recessed gate stack 248. The etching process may include any suitable process, such as a dry etching process, a wet etching process, an RIE, or combinations thereof, configured to selectively remove the gate stack 248 without substantially etching the helmet layer 220, the gate spacers 230a, the CESL 240, and the ILD layer 242. The resulting height of the recessed gate stack 248 may be controlled by the duration of the etching process. In the present embodiments, after the selective recessing of the gate stack 248 and the gate stack 250, a top surface of the recessed gate stack 248 and a top surface of the recessed gate stack 250 are below the top surface of the helmet layer 220. As such, the combination of the dummy fin 216 and the helmet layer 220 electrically and physically isolates the gate stack 250 from the gate stack 248, such that gate terminals of the transistor formed over the first region 202N and the transistor formed over the formed over the second region 202P may be separately controlled.

Such further processes may also include, for example, performing another etching process to selectively recess the gate spacers 230a. The selective recessing of the gate stack 248 and selective recess of the gate spacers 230a form a cap trench. Such further processes may also include, for example, as shown in FIGS. 17B and 17C, depositing a dielectric layer 252 over the workpiece 200, thereby filling the cap trench. In the present embodiments, the dielectric layer 252 is configured to provide self-alignment capability and etching selectivity during subsequent fabrication processes including, for example, patterning the ILD layer 242 to form source/drain contact openings over the epitaxial source/drain features 236N/236P. Accordingly, in the present embodiments, the dielectric layer 252 has a composition different from that of the ILD layer 242. In some embodiments, the dielectric layer 252 may include SiN, SiCN, SiOC, SiON, SiOCN, other suitable materials, or combinations thereof and may be deposited by any suitable method, such as ALD, CVD, PVD, other suitable methods, or combinations thereof. Subsequently, portions of the dielectric layer 252 formed over the ILD layer 242 may be removed by one or more CMP process, thereby providing the workpiece 200 a planar top surface. As illustrated in FIGS. 17A and 17C, a portion of the helmet layer 220 is embedded in the dielectric layer 252.

Such further processes may also include forming a multi-layer interconnect (MLI) structure (not depicted) thereover. The MLI structure may include various interconnect features, such as vias and conductive lines, disposed in dielectric layers, such as etch stop layers (ESLs) and ILD layers. In some embodiments, the vias are vertical interconnect features configured to interconnect a device-level contact, such as an S/D contact (not depicted) or a gate contact (not depicted), with a conductive line or interconnect different conductive lines, which are horizontal interconnect features. The ESLs and the ILD layers of the MLI structure may have substantially same compositions as those discussed above with respect to the CESL 240 and the ILD layer 242, respectively. The vias and the conductive lines may each include any suitable conductive material, such as Co, W, Ru, Cu, Al, Ti, Ni, Au, Pt, Pd, a metal silicide, other suitable conductive materials, or combinations thereof, and be formed by a series of patterning and deposition processes. Additionally, each via and conductive line may additionally include a barrier layer that comprises TiN and/or TaN.

FIGS. 18 and 19 depict a first alternative embodiment. As represented in FIG. 18, one or more airgaps 231 (i.e., seams or voids) may be formed during the deposition of the spacer layer 230. In the present embodiment, the airgap 231 is formed in a portion of the spacer layer 230 disposed laterally between the fin-shaped active region 205 and dummy fin 216. Upon conclusion of the fabrication process, as presented by FIG. 19, the semiconductor device 200 includes the airgap 231 disposed between the source/drain feature 236P/236N and the dummy fin 216. The formation of the airgaps 231 may further reduce the parasitic capacitance of the semiconductor device 200.

In the embodiments described above, the fin-shaped active region 205 is kept substantially intact after the performing of the etching process 227 (shown in FIG. 9A). Since the channel layers 208 and the sacrificial layers 206 in the source/drain regions 205S/D would be removed by a subsequent etching process to form source/drain trenches 232 (shown in FIG. 12A), etchants and/or other parameters (e.g., pressure, gas flow, temperature) used in the etching process 227 may be configured to adjust the etchant selectivity between the cladding layer 214 and the channel layer 208, thereby adjusting the height of the fin-shaped active region 205 after the etching process 227 and adjusting a height of the source/drain spacers 230b.

Figure 20:
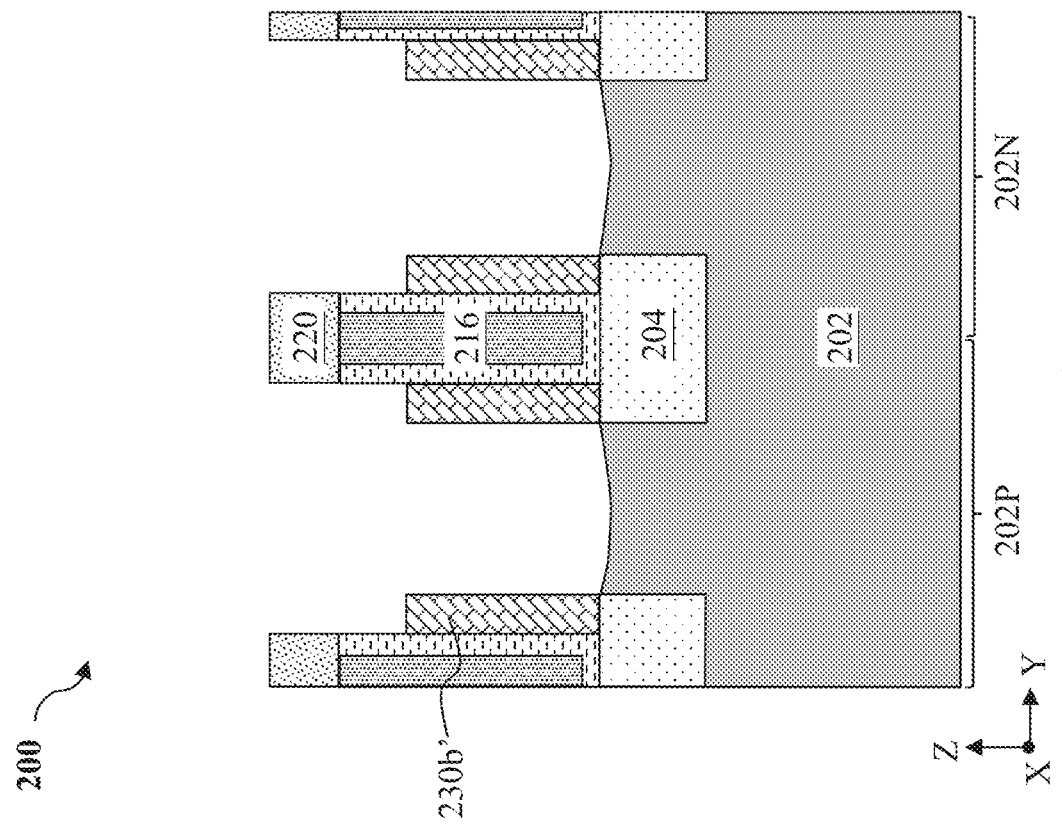
FIGS. 20 and 21 (FIGS. 18-21) illustrate cross-sectional views of a workpiece during a fabrication process according to the method of FIG. 1, according to a second alternative embodiment and one or more aspects of the present disclosure.
Figure 21:
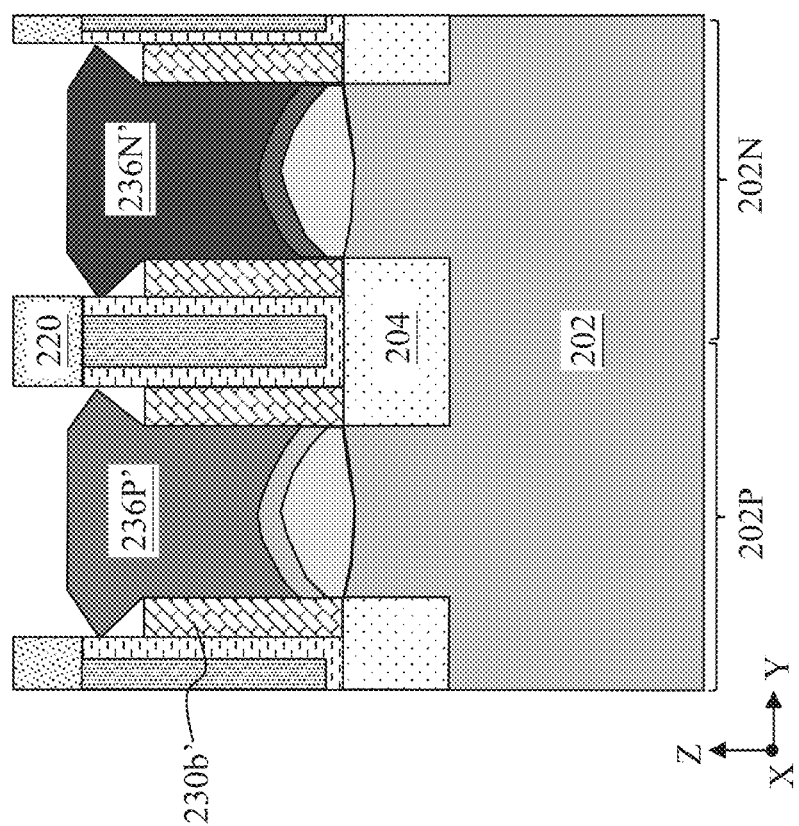

FIGS. 20-21 depict an alternative embodiment where a height of the source/drain spacer 230b may be changed. In some embodiments, during the formation of the source/drain trenches 232, the source/drain spacer 230b may be recessed. The recessed source/drain spacer 230b may be referred to as source/drain spacer 230b'. A top surface of the source/drain spacer 230b' is below the top surface of the dummy fin 216 and the height of the source/drain spacer 230b' is smaller than a height of the dummy fin 216. After forming the source/drain spacer 230b', operations in blocks 122-130 of method 100 may be performed, thereby finishing the fabrication of the workpiece 200. FIG. 21 depicts a cross-sectional view of the workpiece 200 after forming source/drain features 236P' and 236N'. The source/drain feature 236P' is in a way similar to the source/drain feature 236P and the source/drain feature 236N' is in a way similar to the source/drain feature 236N except that the profiles of the source/drain features 236P' and 236N' are different than those of the source/drain features 236P and 236N when viewed from the X direction. More specifically, in embodiments described with reference to FIGS. 13A-13C, the source/drain features 236P and 236N have a substantially uniform width W1 bottom to up and the width W1 is substantially equal to the width of the fin-shaped active region 205 along the Y direction. In embodiments represented in FIG. 21, due to the reduced height of the source/drain spacers 230b', with a lower portion of the source/drain features 236P' and 236N' being confined laterally along the Y direction, an upper portion of the source/drain features 236P' and 236N' is allowed to extend laterally along the Y direction, overhangs the lower portion of the source/drain features 236P' and 236N', and disposed directly over the source/drain spacers 230b'. That is, a width of the upper portion of the source/drain features 236P' and 236N' may be greater than the width W1 of the lower portion of the source/drain features 236P' and 236N'.

In embodiments described above with reference to the FIGS. 10A-10B, the spacer layer 230 is a single-layer structure. In some other embodiments, the spacer layer 230 may be a multi-layer structure that includes two or more dielectric layers. For example, the formation of the spacer layer 230 may include forming a first dielectric layer (e.g., a first dielectric layer 2301 shown in FIG. 22A) conformally over the workpiece 200 and forming a second dielectric layer (e.g., second dielectric layer 2302 shown in FIG. 22A) deposited conformally over the first dielectric layer. In some implementations, a dielectric constant of the first dielectric layer may be greater than that of the second dielectric layer, and the first dielectric layer is more etch resistant than the second dielectric layer. In some embodiments, the first dielectric layer may include silicon carbonitride, silicon nitride, zirconium oxide, aluminum oxide, or a suitable dielectric material, the second dielectric layer may include silicon oxide, silicon oxycarbide, or a suitable low-k dielectric material. In an embodiment, the spacer layer 230 includes a silicon oxide layer formed on a silicon nitride layer. After forming the multi-layer spacer layer 230, operations in blocks 118-130 may be performed, thereby finishing the fabrication of the workpiece 200. FIGS. 22A and 22B depict cross-sectional views of the workpiece 200 that includes gate spacers 230a" and source/drain spacers 230b". The gate spacers 230a" include the second dielectric layer 2302 formed on the first dielectric layer 2301 and the source/drain spacers 230b" include the second dielectric layer 2302 embedded in the first dielectric layer 2301. That is, although the gate spacers 230a" and the source/drain spacers 230b" are formed by common deposition processes and a common etching process, the resulted structures of the gate spacers 230a" and the source/drain spacers 230b" are different. It is understood that the structure of the source/drain spacers 230b" may depend on the width T1 (shown in FIG. 9A) of the trenches 228 and the deposition thicknesses of the first and second dielectric layers 2301 and 2302.

Although not intended to be limiting, one or more embodiments of the present disclosure provide many benefits. For example, the present disclosure includes forming source/drain spacers defining a source/drain trench and then forming a source/drain feature in the source/drain trench. As such, the lateral growth of the source/drain feature may be confined by the source/drain spacers, reducing an overlapping area between the source/drain feature and the gate stack of a transistor and thus reducing a parasitic capacitance. The reduced parasitic capacitance may thus lead to an increased device speed. The lateral confinement of the source/drain features may also advantageously increase the distance between two adjacent source/drain features, thereby reducing the possibility of unintentional electrical shorting between two adjacent source/drain features. In some embodiments, due to the formation of the source/drain spacers, the dummy fin may be configured to have a smaller width, thereby reducing the spacing of two adjacent active regions and increasing the device density. In some implementations, the source/drain spacers may be tensile strained dielectric spacers such that the source/drain features may be strained, and the carrier mobility may be enhanced.

The present disclosure provides for many different embodiments. Semiconductor devices and methods of fabrication thereof are disclosed herein. In one exemplary aspect, the present disclosure is directed to a method. The method includes providing a workpiece including an active region protruding from a substrate and comprising a channel region disposed adjacent to a source/drain region, a cladding layer extending along a sidewall surface of the active region, and an isolation structure spaced apart from the active region by the cladding layer. The method also includes forming a dummy gate structure over the channel region of the active region and a first portion of the cladding layer, after the forming of the dummy gate structure, selectively removing a second portion of the cladding layer not covered by the dummy gate structure to form a trench between the isolation structure and the active region, forming a dielectric spacer the trench, recessing the source/drain region of the active region to form a source/drain opening without substantially etching the dielectric spacer, forming a source/drain feature to fill the source/drain opening, and replacing the dummy gate structure with a gate stack.

In some embodiments, the forming of the dielectric spacer may include depositing a dielectric layer over the workpiece and etching back the dielectric layer to form the dielectric spacer in the trench. In some embodiments, the dielectric layer may be a conformal dielectric layer, and the etching back of the dielectric layer may also form a gate spacer extending along a sidewall surface of the dummy gate structure. In some embodiments, the depositing of the dielectric layer may further form an air gap within the dielectric layer, and the dielectric spacer may include the air gap. In some embodiments, the depositing of the dielectric layer may include conformally depositing a first dielectric layer over the workpiece and conformally depositing a second dielectric layer over the first dielectric layer. A dielectric constant of the first dielectric layer may be greater than a dielectric constant of the second dielectric layer. In some embodiments, the active region may include a vertical stack of alternating channel layers and sacrificial layers, and a composition of the cladding layer may be the same as a composition of the sacrificial layers. In some embodiments, the replacing of the dummy gate structure with the gate stack may include selectively removing the dummy gate structure to form a first opening, selectively removing the sacrificial layers and the portion of the cladding layer to form second openings and forming the gate stack in the first and second openings. In some embodiments, the method may also include, after the forming of the source/drain opening, selectively recessing the sacrificial layers to form inner spacer recesses, depositing a dielectric material over the workpiece to fill the inner spacer recesses, and etching back the dielectric material to form inner spacer features in the inner spacer recesses. In some embodiments, the selectively removing of the second portion of the cladding layer may include performing an anisotropic dry etching process. In some embodiments, the isolation structure may include a lower portion having a first composition and an upper portion having a second composition different from the first composition, a top surface of the lower portion may be substantially coplanar with a top surface of the dielectric spacer and a top surface of the active region.

In another exemplary aspect, the present disclosure is directed to a method. The method includes providing a first fin-shaped active region and a second fin-shaped active region each protruding from a substrate and oriented lengthwise in a first direction, forming cladding layers extending along sidewalls of the first and second fin-shaped active regions and oriented lengthwise in the first direction, forming a dielectric feature over the substrate to fill space between two adjacent cladding layers, forming a gate structure over channel regions of the first and second fin-shaped active regions, the gate structure orientated lengthwise in a second direction substantially perpendicular to the first direction and covering a first portion of the cladding layers, performing an etching process to remove a second portion of the cladding layers not covered by the gate structure to form sidewall spacer trenches, forming a dielectric spacer in each of the sidewall spacer trenches, and after the forming of the dielectric spacers, forming source/drain features in source/drain regions of the first and second fin-shaped active regions.

In some embodiments, the forming of the dielectric spacers may include depositing a conformal dielectric layer over the substrate, and selectively recessing the conformal dielectric layer to form the dielectric spacer in each of the sidewall spacer trenches. The selectively recessing of the conformal dielectric layer may further form gate spacers extending along sidewalls of the gate structure. In some embodiments, the forming of the source/drain features may include selectively removing the source/drain regions of the first and second fin-shaped active regions to form source/drain openings, epitaxially forming a first semiconductor layer in the source/drain openings, epitaxially forming a second semiconductor layer over the first semiconductor layer, and epitaxially forming a third semiconductor layer over the second semiconductor layer to fill the source/drain openings, a dopant concentration of the third semiconductor layer may be greater than a dopant concentration of the second semiconductor layer. In some embodiments, the first semiconductor layer, the second semiconductor layer, and the third semiconductor layer may be in direct contact with the dielectric spacer. In some embodiments, the method may also include, after the forming of the source/drain features, selectively removing the gate structure to form a gate trench, the gate trench exposing the portion of the cladding layers, selectively removing the first portion of the cladding layers, and forming a gate stack over the substrate to fill the gate trench. In some embodiments, the performing of the etching process selectively may remove the second portion of the cladding layers without substantially etching the first and second fin-shaped active regions, and a height of the dielectric spacer may be substantially equal to a height of the first and second fin-shaped active regions. In some embodiments, a top surface of the dielectric spacer may be below a top surface of the source/drain features.

In yet another exemplary aspect, the present disclosure is directed to a semiconductor device. The semiconductor device includes a plurality of channel members disposed over a substrate and coupled to a source/drain feature along a first direction, a gate structure wrapping around each channel member of the plurality of channel members, and a dielectric spacer disposed adjacent to the source/drain feature along a second direction substantially perpendicular to the first direction, the source/drain feature includes at least two semiconductor layers, and each of the at least two semiconductor layers is in direct contact with the dielectric spacer.

In some embodiments, the semiconductor device may also include gate spacers extending along sidewalls of the gate structure, and a composition of the dielectric spacer may be the same as a composition of the gate spacers. In some embodiments, the semiconductor device may also include a dummy fin disposed adjacent to the dielectric spacer and a helmet layer disposed on the dummy fin without being disposed on the dielectric spacer, the dielectric spacer may be disposed between the dummy fin and the source/drain feature along the second direction and a composition of the helmet layer may be different from a composition of the dummy fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a workpiece comprising:
   an active region protruding from a substrate and comprising a channel region disposed adjacent to a source/drain region,
   a cladding layer extending along a sidewall surface of the active region, and
   an isolation structure spaced apart from the active region by the cladding layer;
   forming a dummy gate structure over the channel region of the active region, wherein the dummy gate structure covers a first portion of the cladding layer;
   after the forming of the dummy gate structure, selectively removing a second portion of the cladding layer not covered by the dummy gate structure, thereby forming a trench between the isolation structure and the active region;
   forming a dielectric spacer in the trench
   recessing the source/drain region of the active region to form a source/drain opening without substantially etching the dielectric spacer;
   forming a source/drain feature to fill the source/drain opening; and
   after the forming of the source/drain feature, replacing the dummy gate structure with a gate stack.

2. The method of claim 1, wherein the forming of the dielectric spacer comprises:
   depositing a dielectric layer; and
   etching back the dielectric layer to form the dielectric spacer in the trench.

3. The method of claim 2,
   wherein the etching back of the dielectric layer further forms a gate spacer extending along a sidewall surface of the dummy gate structure.

4. The method of claim 2, wherein the depositing of the dielectric layer further forms an air gap within the dielectric layer, and the dielectric spacer comprises the air gap.

5. The method of claim 1,
   wherein the active region comprises a vertical stack of alternating channel layers and sacrificial layers, and
   wherein a composition of the cladding layer is the same as a composition of the sacrificial layers.

6. The method of claim 5, wherein the replacing of the dummy gate structure with the gate stack comprises:
   selectively removing the dummy gate structure;
   selectively removing the sacrificial layers and the first portion of the cladding layer; and
   forming the gate stack wrapping around the channel layers.

7. The method of claim 6, further comprising:
   after the forming of the source/drain opening, selectively recessing the sacrificial layers to form inner spacer recesses;
   depositing a dielectric material over the workpiece to fill the inner spacer recesses; and
   etching back the dielectric material to form inner spacer features in the inner spacer recesses.

8. The method of claim 1, wherein the selectively removing of the second portion of the cladding layer comprises performing an anisotropic dry etching process.

9. The method of claim 1, wherein the isolation structure comprises a lower portion having a first composition and an upper portion having a second composition different from the first composition,
   wherein a top surface of the lower portion is substantially coplanar with a top surface of the dielectric spacer and a top surface of the active region.

10. A method, comprising:
    providing a first fin-shaped active region and a second fin-shaped active region each protruding from a substrate and oriented lengthwise in a first direction;
    forming cladding layers extending along sidewalls of the first and second fin-shaped active regions and oriented lengthwise in the first direction;
    forming a dielectric feature over the substrate to fill space between two adjacent cladding layers;
    forming a dummy gate structure over channel regions of the first and second fin-shaped active regions, the dummy gate structure orientated lengthwise in a second direction substantially perpendicular to the first direction and covering a first portion of the cladding layers;

after the forming of the dummy gate structure, performing an etching process to remove a second portion of the cladding layers not covered by the dummy gate structure, thereby forming sidewall spacer trenches;

forming a dielectric spacer in each of the sidewall spacer trenches; and after the forming of the dielectric spacers, recessing portions of the first and second fin-shaped active regions not covered by the dummy gate structure, thereby forming source/drain openings;

forming source/drain features in the source/drain openings.

11. The method of claim 10, wherein the forming of the dielectric spacers comprises:

depositing a conformal dielectric layer over the substrate; and selectively recessing the conformal dielectric layer to form the dielectric spacer in each of the sidewall spacer trenches, wherein the selectively recessing of the conformal dielectric layer further forms gate spacers extending along sidewalls of the dummy gate structure.

12. The method of claim 10, wherein the forming of the source/drain features comprises:

epitaxially forming a first semiconductor layer in the source/drain openings;

epitaxially forming a second semiconductor layer over the first semiconductor layer; and epitaxially forming a third semiconductor layer over the second semiconductor layer to fill the source/drain openings, wherein a dopant concentration of the third semiconductor layer is greater than a dopant concentration of the second semiconductor layer.

13. The method of claim 12, wherein the first semiconductor layer, the second semiconductor layer, and the third semiconductor layer are in direct contact with the dielectric spacer.

14. The method of claim 10, further comprising:

after the forming of the source/drain features, selectively removing the dummy gate structure to form a gate trench, the gate trench exposing the first portion of the cladding layers;

selectively removing the first portion of the cladding layers; and forming a gate stack over the substrate to fill the gate trench.

15. The method of claim 10, wherein the performing of the etching process selectively removes the second portion of the cladding layers without substantially etching the first and second fin-shaped active regions, and a height of the dielectric spacer is substantially equal to a height of the first and second fin-shaped active regions.

16. The method of claim 10, wherein a top surface of the dielectric spacer is below top surfaces of the source/drain features.

17. A method, comprising:

forming a fin-shaped structure over a substrate having a first region and a second region;

forming a cladding layer extending along a sidewall surface of the fin-shaped structure, the cladding layer having a first portion adjacent to the first region and a second portion adjacent to the second region;

forming a dielectric fin adjacent to the cladding layer, wherein when viewed from top, the fin-shaped structure, the cladding layer and the dielectric fin extend lengthwise along a same first direction;

forming a dummy gate structure covering the first portion of the cladding layer;

after the forming of the dummy gate structure, replacing the second portion of the cladding layer with a dielectric layer;

after forming the dielectric layer, recessing the second region of the fin-shaped structure to form a source/drain opening; and forming a source/drain feature in the source/drain opening.

18. The method of claim 17, further comprising:

forming a gate spacer extending along a sidewall surface of the dummy gate structure.

19. The method of claim 17, wherein the fin-shaped structure comprises a plurality of channel layers interleaved by a plurality of sacrificial layers, a composition of the plurality of channel layers is different than a composition of the plurality of sacrificial layers, and the plurality of sacrificial layers and the cladding layer have the same composition, and the method further comprises:

performing an etching process to selectively remove the dummy gate structure, the plurality of sacrificial layers and the first portion of the cladding layer; and forming a gate stack to wrap around the plurality of channel layers.

20. The method of claim 17, wherein the second portion of the cladding layer is disposed laterally adjacent to the first portion of the cladding layer along the first direction, and the dummy gate structure is in direct contact with both the second portion of the cladding layer and the fin-shaped structure.

* * * * *